US006645685B2

(12) United States Patent
Takata et al.

(10) Patent No.: US 6,645,685 B2
(45) Date of Patent: Nov. 11, 2003

(54) PROCESS FOR PRODUCING PRINTED WIRING BOARD

(75) Inventors: Masakazu Takata, Tokyo (JP); Hidetoshi Miura, Tokyo (JP); Tamotsu Horiuchi, Tokyo (JP); Munetoshi Irisawa, Tokyo (JP); Masanori Natsuka, Tokyo (JP); Kenji Tsuda, Tokyo (JP); Kazuchiyo Takaoka, Tokyo (JP); Kenji Hyodo, Tokyo (JP)

(73) Assignee: Mitsubishi Paper Mills Limited, Tokyo (JP)

( * ) Notice: Subject to any disclaimer, the term of this patent is extended or adjusted under 35 U.S.C. 154(b) by 49 days.

(21) Appl. No.: 09/945,807

(22) Filed: Sep. 5, 2001

(65) Prior Publication Data

US 2002/0102772 A1 Aug. 1, 2002

(30) Foreign Application Priority Data

| Sep. 6, 2000 | (JP) | ........................ | 2000-269543 |
| Dec. 1, 2000 | (JP) | ........................ | 2000-366644 |
| Mar. 16, 2001 | (JP) | ........................ | 2001-077014 |
| Apr. 11, 2001 | (JP) | ........................ | 2001-112602 |

(51) Int. Cl.$^7$ .................. G03G 13/05; H01L 21/44
(52) U.S. Cl. ............. 430/31; 430/58.4; 430/58.55; 430/318; 347/238
(58) Field of Search ................. 430/31, 97, 100, 430/103, 117, 118, 119, 120, 124, 318, 58.4, 58.55; 347/238; 438/125

(56) References Cited

U.S. PATENT DOCUMENTS

| 4,063,948 A | * | 12/1977 | Lind ........................ 96/1.6 |
| 5,418,115 A | * | 5/1995 | Tsubai et al. ............ 430/323 |
| 5,494,764 A | * | 2/1996 | Hyodo ....................... 430/31 |
| 6,444,379 B1 | * | 9/2002 | Kaneda et al. ............ 430/22 |

FOREIGN PATENT DOCUMENTS

| JP | 52-002437 | | 1/1977 |
| JP | 59-168462 | | 9/1984 |
| JP | 59-168463 | | 9/1984 |
| JP | 59-168464 | | 9/1984 |
| JP | 63-129689 | | 6/1988 |
| WO | WO 99/52335 | * | 10/1999 |

* cited by examiner

Primary Examiner—John Goodrow
(74) Attorney, Agent, or Firm—Paul E. White, Jr.; Manelli Denison & Selter PLLC

(57) ABSTRACT

Disclosed is disclosed a process for producing a printed wiring board which comprises the steps of:

a) exposing a wiring board having at least one photoconductive layer in which its chargeability is changed by light exposure on at least one surface of a conductive support which comprises an insulating substrate and at least one metal conductive layer provided at least one surface thereof through a resist pattern;

b) charging the photoconductive layer to form an electrostatic latent image;

c) forming a toner image on the photoconductive layer by toner developing treatment;

d) removing a portion of the photoconductive layer to which no toner is attached by dissolution to form a resist image; and e) removing a portion of the metal conductive layer other than a portion where the resist image is formed by etching.

24 Claims, No Drawings

PROCESS FOR PRODUCING PRINTED WIRING BOARD

BACKGROUND OF THE INVENTION

1. Field of the Invention

This invention relates to a process for producing a printed wiring board utilizing an electrophotographic method, particularly to a process for producing a printed wiring board utilizing a wiring board provided thereon a photoconductive layer in which its chargeability is changed by light exposure, and comprising an electrostatic image forming step containing at least image pattern exposure by UV light and a charging step subsequent thereto, a resist forming step by toner development, an alkali dissolution step of the photoconductive layer, and an etching step of a metal conductive layer.

2. Prior Art

In a conventional preparation of a printed wiring board, a printed circuit has generally been prepared onto an insulating substrate by the following steps. That is, laminating a photosensitive film onto a copper-clad laminated board wherein an insulating substrate is coated with a copper film, superposing a negative thereon, followed by exposure, development, removal of unnecessary portion of the copper film other than a circuit pattern, and finally, exfoliating the photosensitive layer. However, in this method using a photosensitive layer, since a thickness of the photosensitive film is generally as thick as about 50 μm, a circuit pattern formed by exposure and development is not sharp, and it is difficult to laminate the photosensitive film uniformly on a copper film surface.

In order to improve resolution, etc. of the photosensitive film, there is disclosed a method of forming a photosensitive resist on a substrate by electrode position as is disclosed in Japanese Provisional Patent Publications No. 262855/1987, No. 4672/1989, etc. However, a photo resist for electrode position has generally a problem of low sensitivity. Particularly, it is difficult to irradiate inside the through holes, and in case of positive method where irradiated portion becomes soluble for a dissolving solution, it requires energy around several hundreds mJ/cm$^2$ in order to give sufficient solubility. Therefore, it has been improper to use laser and the like for irradiation.

Further, as a preparation method for a printed wiring board other than that utilizing the photosensitive resist, there is disclosed a method of utilizing an electrophotographic method in West German Patents No. 2526720 and No. 3210577, Japanese Provisional Patent Publications No. 2437/1977, No. 48736/1982 and No. 168462/1984. In Japanese Provisional Patent Publication No. 129689/1988, there is disclosed a preparation method for a printed wiring board utilizing an electrophotographic material having specific sensitivity for wavelength of lasers. An example of using the electrophotographic method by directly drawing an image to be formed by laser on a substrate has already been applied for an electrophotographic material used in electrophotographic lithographic printing plate, etc. and a method has been now in a practical use that utilizes a laser scanning exposure, based on data directly sent from a computer without using a photomask, to form a high density image.

In a printed wiring board prepared by utilizing the electrophotographic method (hereinafter referred to as "electrophotographic printed wiring board"), different from a photosensitive dry film resist or a liquid photo resist, it is possible to set a thickness of a resist small, thereby it is advantageous in coating and drying conditions, alkali developing condition, in keeping the etching factor of circuit patterns large enough after etching, so that it is excellent in reproducibility of fine lines and productivity. In addition, since it is a liquid resist, it is possible for a resist film to comply with unevenness of a substrate, thereby decreasing defects such as open circuit or leaching, etc. Further, there has been an increasing expectation for a practical use, since it is excellent in many properties such as maintenance of alkali developing solution, handling of a substrate after coating, ability for perfect protection of through holes, etc. as compared with other resist materials.

Preparation of the electrophotographic printed wiring board is carried out as follows. On the surface of a photoconductive layer of a wiring board in which a photoconductive layer was coated on a conductive support comprising an insulating substrate and provided thereon, a metal conductive layer, charging and exposure according to a wiring pattern are carried out to form an electrostatic latent image corresponding to an exposed portion. To this electrostatic latent image, toner developing treatment is carried out to obtain a toner image, and using this toner image as a resist, a portion of the photoconductive layer other than the toner image is removed by dissolution to prepare a resist image comprising the toner image and the photoconductive layer. Removal of unnecessary portion of the metal conductive layer by dissolution and succeeding processes for preparation of the printed wiring board can be carried out in the same manner as conventional methods.

In a method of preparing an electrophotographic printed wiring board wherein a wiring pattern is formed on both surfaces of the insulating substrate, as disclosed in Japanese Provisional Patent Publication No. 209606/1998, at least a metal conductive layer and a photoconductive layer are provided in this order on both surfaces of an insulating substrate, the obtained board is mounted on a flat table of an exposing device, adjusted to a proper place (positioning), then charging is conducted. Then, exposure is carried out on one surface of a photoconductive layer to form an electrostatic latent image. After turning over the board, positioning and charging are conducted again, followed by exposure on the other surface of the photoconductive layer to form an electrostatic latent image. After that, toner developing treatment and succeeding processes are conducted in the same manner as the above, to prepare a printed wiring board with circuit patterns formed on both surfaces.

However, according to this method, there is a problem that when the board on the flat table is turned over after exposure, the surface having the electrostatic latent image initially formed by exposure and charging makes a mechanically strong contact with the flat table of the exposing device, and electric charge distribution of the contacted surface is disturbed. Similarly, even after the electrostatic latent images are formed on the both surfaces, there is a problem such that the electrostatic latent image is distorted by contacting with a conveying member for transport to the toner developing process. Since an image quality of the toner image is largely dependent on the electric charge distribution of the electrostatic latent image, distortion of the electrostatic latent image produced is reflected on the toner image as it is, resulting a problem of shortcircuiting, breakage or open circuit, etc.

In addition, this direct circuit drawing method by laser using electrophotographic method requires an exposure dose as low as 1 to 50 μJ/cm$^2$, it is possible to use as laser a semiconductor laser which is less expensive and requires less power output. However, since its photoconductive layer has high photosensitivity for wavelength of 500 to 900 nm, there are problems that red laser diode sensor used for positioning of the printed wiring board during an image forming process causes an image fog at the photoconductive layer and that it is impossible to carry out the succeeding processes under visible light where the process are done efficiently from charging of the photoconductive layer, image-exposing, and until toner developing of the electrostatic latent image.

Further, a charge transfer material generally used for an organic electrophotographic material inherently has a function to transport a photo-carrier (a hole or an electron) generated from a charge generating material that has absorbed a visible light or infrared rays according to an electric field applied on the photoconductive layer. Generally, the charge generating material is a colored dye or pigment, while the charge transfer material is a compound that absorbs ultra violet rays and does not absorb infrared rays or a visible light. When it is considered to generate a photo-carrier by irradiating UV light that is absorbed by the charge transfer material, poly(vinylcarbazole) has been well known as a substance effectively generating a photo-carrier. However, it is not suitable to use it as a photosensitive resin in order to form an extra-fine pattern as seen in a printed wiring board, since it is extremely poor in a film-forming property, and also it is extremely immiscible with other resins with a good film-forming property. On the other hand, as a charge transfer material used for an organic electrophotographic material, there have recently been known compounds with low molecular weights including a hydrazone compound, a triphenyl amine compound, a stilbene compound, etc. However, those compounds have by themselves extremely low efficiency in generating photo-carrier. Therefore, in an electrophotographic material comprising a photoconductive layer constituted solely by the charge transfer material with a low molecular weight and a binder resin, and not containing a charge generating material, it has not yet been known a system having a practical photosensitivity for UV lights.

SUMMARY OF THE INVENTION

An object of the present invention is to provide a printed wiring board, by using an electrophotographic material having photosensitivity for a range of wavelength shorter than 500 nm, that is free from image defect even though it makes contact with a conveying member or a flat table of an exposing device during a pattern image forming process, that will not cause an image distortion by a sensor, and that enable to carry out the pattern image forming processes under visible light where the process is done efficiently.

The present inventors have made extensive and intensive studies for solving the above problems, and as a result, they have found that it is possible to exclude a mechanical contact from the processes after formation of the electrostatic latent image until prior to the toner developing, by initially exposing a wiring board having a photoconductive layer which changes its chargeability by light exposure on the surfaces of a conductive support which comprises an insulating substrate and metal conductive layers provided on the surface thereof through a resist pattern; and then, charging the photoconductive layer to form an electrostatic latent image; forming a toner image on the photoconductive layer by toner developing treatment; removing a portion of the photoconductive layer to which no toner is attached by dissolution to form a resist image; and removing a portion of the metal conductive layer other than a portion where the resist image is formed by etching. They have found that this process enables to prepare a printed wiring board with fewer defects such as residual copper, shortcircuiting, leaching or open circuit, etc.

The present inventors have also found that copper circuits can be formed on both surfaces of the wiring board by a process wherein the wiring board having photoconductive layers in which their chargeabilities are changed by light exposure provided on both surface of a conductive support which comprises an insulating substrate and metal conductive layers provided on both surface thereof is exposed through a resist pattern on one surface followed by the other, then, the both surfaces of the photoconductive layers are charged to form electrostatic latent images on both surfaces, followed by carrying out toner image formation, resist image formation, and etching of the metal conductive layers for both surfaces, either separately or simultaneously.

Further, the present inventors have found that by using a photoconductive layer comprising a charge transfer material with a low molecular weight having a specific chemical structure, and consisting no generally used colored charge generating material (an organic pigment, a sensitizing dye), it is possible to provide a wiring board that is able to form an image by exposing to UV light. It is possible to form an electrophotographic pattern image under visible light or yellow safe light by making this photoconductive layer not change its chargeability by light exposure with a wavelength of 500 nm or longer.

The present invention relates to a process for producing a printed wiring board which comprises the steps of:

a) exposing a wiring board having at least one photoconductive layer in which its chargeability is changed by light exposure on at least one surface of a conductive support which comprises an insulating substrate and at least one metal conductive layer provided at least one surface thereof through a resist pattern;

b) charging the photoconductive layer to form an electrostatic latent image;

c) forming a toner image on the photoconductive layer by toner developing treatment;

d) removing a portion of the photoconductive layer to which no toner is attached by dissolution to form a resist image; and e) removing a portion of the metal conductive layer other than a portion where the resist image is formed by etching.

DESCRIPTION OF THE PREFERRED EMBODIMENTS

In the following, the embodiments of the present invention are explained in detail.

The photoconductive layer to be used in the present invention comprises an anthraquinone type dye represented by the formula (I), a charge transfer material, and a resin that is soluble for an alkali solution.

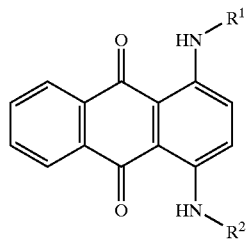

(I)

In the formula (I), each of $R^1$ and $R^2$ represents an alkyl group, an aryl group, or an aralkyl group and those substituents may have a further substituent(s). $R^1$ and $R^2$ may be the same or different from each other.

As a charge transfer material to be used in the present invention, compounds represented by the formulae (II), (III), (IV), (V) and (VI) are preferred.

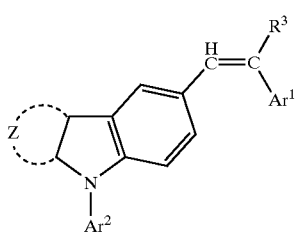

(II)

In the formula (II), $R^3$ represents a hydrogen atom, an alkyl group, or an aryl group, and $Ar^1$ and $Ar^2$ both represent an aryl group. Z represents an alkylene group with a carbon number of 3 or 4, that forms a 5-membered ring or 6-membered ring bonded to a pyrrolidine ring. Those substituents other than the hydrogen atom may be further substituted, and $Ar^1$ and $Ar^2$ may be the same or different from each other.

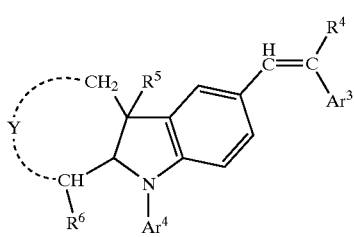

(III)

In the formula (III), $R^4$ represents a hydrogen atom, an alkyl group, or an aryl group, and $Ar^3$ and $Ar^4$ both represent an aryl group. Each of $R^5$ and $R^6$ represents a hydrogen atom or an alkyl group wherein at least one of $R^5$ and $R^6$ is an alkyl group. Y is an alkylene group with a carbon number of 1 or 2 that forms a 5-membered ring or 6-membered ring with two carbon atoms bonded to a pyrrolidine ring. Those substituents other than the hydrogen atom may be further substituted. $Ar^3$ and $Ar^4$, or $R^5$ and $R^6$ may be the same or different from each other.

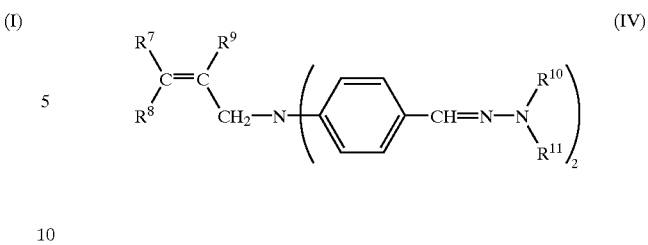

(IV)

In the formula (IV), each of $R^7$, $R^8$ and $R^9$ represents a hydrogen atom or an alkyl group, and each of $R^{10}$ and $R^{11}$ represents an alkyl group or an aryl group. Those substituents other than the hydrogen atom may be further substituted. $R^7$, $R^8$ and $R^9$, or $R^{10}$ and $R^{11}$ may be the same or different from each other.

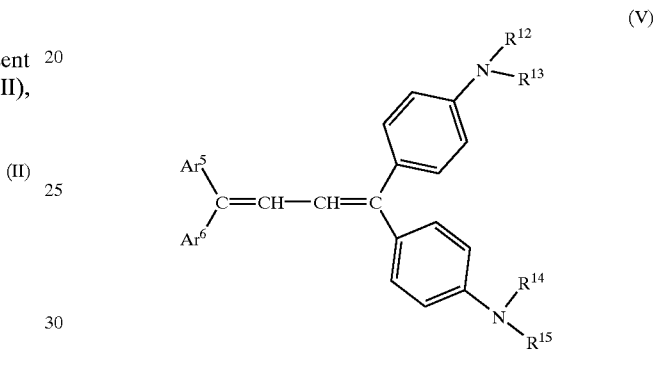

(V)

In the formula (V), each of $Ar^5$ and $Ar^6$ represents an aryl group, and each of $R^{12}$, $R^{13}$, $R^{14}$ and $R^{15}$ represents an alkyl group or an aralkyl group. Those substituents may be further substituted. $Ar^5$ and $Ar^6$ or $R^{12}$, $R^{13}$, $R^{14}$ and $R^{15}$ may be the same or different from each other.

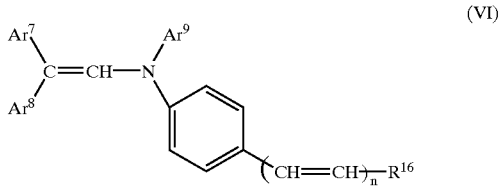

(VI)

In the formula (VI), each of $Ar^7$, $Ar^8$, $Ar^9$ and $R^{16}$ represents an aryl group, and those substituents may be further substituted. $Ar^7$, $Ar^8$, $Ar^9$ and $R^{16}$ may be the same or different from each other. n represents an integer of 1 or 2.

The photoconductive layer of the present invention may contain in addition to at least one of the charge transfer materials represented by the formulae (II), (III), (IV), (V) and (VI) and a binder resin, at least one of the compounds represented by the formulae (VII), (VIII), (IX), (X), (XI), (XII) and (XIII) in an amount of 0.1 to 30% by mass (% by mass is the same meaning as % by weight, hereinafter the same) based on the total amount of the charge transfer materials represented by the formulae (II), (III), (IV), (V) and (VI).

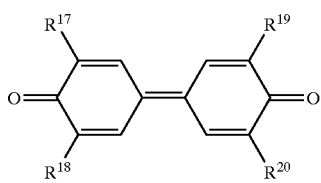
(VII)

In the formula (VII), each of $R^{17}$, $R^{18}$, $R^{19}$ and $R^{20}$ represents an alkyl group or an alkoxy group, which may be further substituted. $R^{17}$, $R^{18}$, $R^{19}$ and $R^{20}$ may be the same or different from each other.

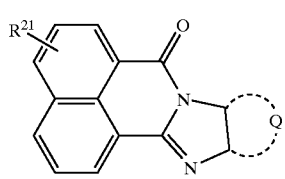
(VIII)

In the formula (VIII), $R^{21}$ is a substituent on a naphthalene ring, representing a hydrogen atom, a halogen atom, a hydroxyl group, a nitro group, an alkylamino group, an alkoxy group, an alkenyloxy group, an aralkyloxy group or an alkenyl group. Q represents an aromatic hydrocarbon residue that is condensed to form a bond with an imidazoline ring.

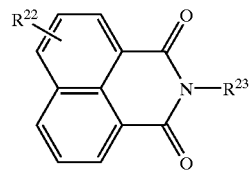
(IX)

In the formula (IX), $R^{22}$ is a substituent on a naphthalene ring, representing a hydrogen atom, a halogen atom, a hydroxyl group, a nitro group, an alkylamino group, an alkoxy group, an alkenyloxy group, an aralkyloxy group or an alkenyl group. $R^{23}$ represents an alkyl group or an aryl group and may be further substituted.

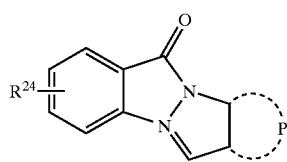
(X)

In the formula (X), $R^{24}$ is a substituent on a benzene ring, representing a hydrogen atom, a halogen atom, or a nitro group. P represents an aromatic hydrocarbon residue that is condensed to form a bond with an imidazoline ring.

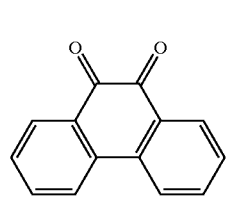
(XI)

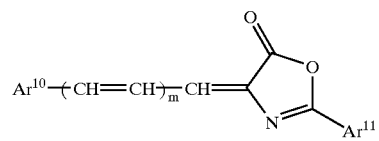
(XII)

In the formula (XII), each of $Ar^{10}$ and $Ar^{11}$ represents an aryl group and may be further substituted. $Ar^{10}$ and $Ar^{11}$ may be the same or different from each other. m represents an integer of 0 or 1.

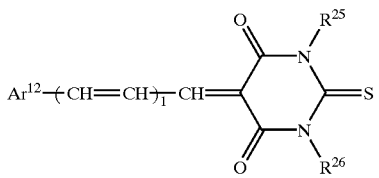
(XIII)

In the formula (XIII), $Ar^{12}$ represents an aryl group and each of $R^{25}$ and $R^{26}$ represents an alkyl group which may be further substituted. $R^{25}$ and $R^{26}$ may be the same or different from each other. l represents an integer of 0 or 1.

Hereinbelow, specific examples of the anthraquinone type dye represented by the formulae (I) is listed below, however, the photoconductive layers are not limited to those examples.

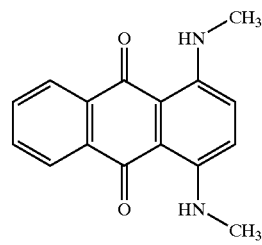
A-1

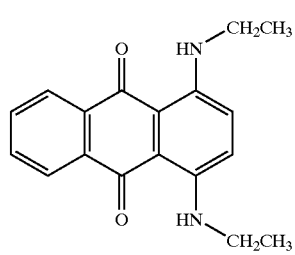
A-2

A-3 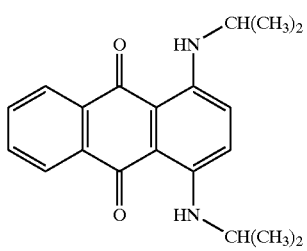

A-4 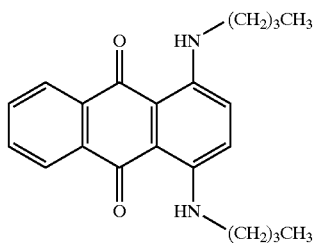

A-5 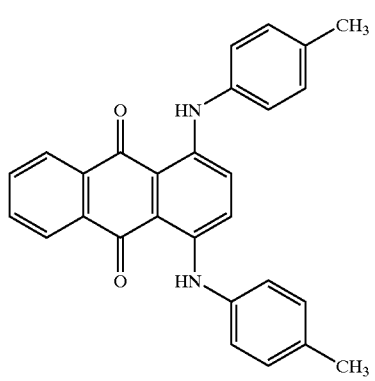

A-6 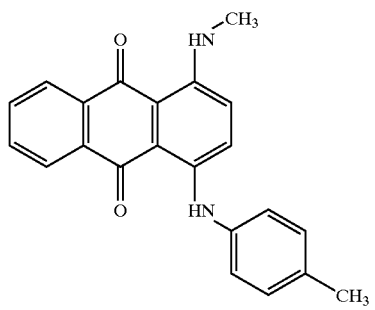

A-7 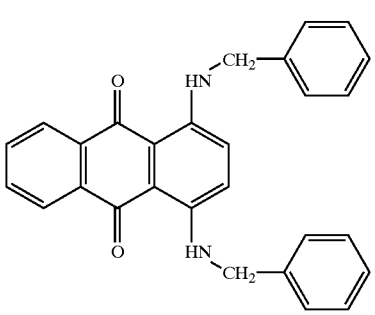

A-8 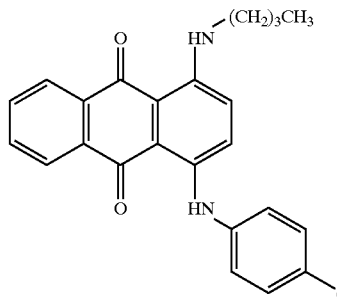

By adding a dye represented by the formula (I) to the photoconductive layer, the photoconductive layer is colored, and aspect of a resist pattern on a conductive layer of a printed wiring board before etching becomes dramatically visible as compared to one without addition of the dye.

As a dye for improving visual contrast of a resin layer, there have been known various kinds of dyes such as a triphenylmethane type dye, an azo type dye, a phthalocyanine type dye, a cyanine type dye, etc. In case of dyeing a photoconductive layer that uses an electrophotographic method, kinds of applicable dyes are extremely limited in practice from the reasons below. That is, since a triphenylmethane type dye and a cyanine type dye are cationic dyes, when they are contained in a photoconductive layer, an ionic conductivity of the photoconductive layer becomes large, thereby making it difficult to form an electrostatic latent image. On the other hand, an azo type dye with an excellent solubility for a solvent generally shows the maximum absorption wavelength for a visible light shorter than 550 nm, therefore, there has not been found a substance which satisfies an object to make the resist more recognizable, and is less expensive. In addition, a phthalocyanine type dye is less soluble for a solvent, therefore, it is difficult to add those dyes uniformly into the photoconductive layer. Moreover, it has a photoconductivity so that it is difficult to form an electrostatic latent image under visible light.

On the contrary, it was figured out that among the anthraquinone type dyes, one with a specific chemical structure represented by the formula (I) has a high solubility for a solvent, and it does not impair the electrophotographic property of the photoconductive layer. Since the dye represented by the formula (I) has no photoconductivity, spectral sensitization is not caused by generation of photo-carrier from the dye itself, or by addition of the dye. Therefore, it is possible to form an electrostatic latent image and carry out toner development under visible light or yellow safe light.

Further, it was found that by adding the dye represented by the formula (I) in a coating solution for forming a photoconductive layer of the present invention on a metal conductive layer, it is possible to prevent a deterioration of the coating solution during preservation under heating over a period of time. Although it is not clear what kind of chemical change in a coating solution occurs during preservation under heating over a period of time, it is a matter of importance to succeed in dramatically improving stability of the coating solution by having a dye with a specific chemical structure co-existed with a mixed coating solution system comprising a charge transfer material and an alkali-soluble resin, in terms of establishing a practical process for preparing a wiring board.

An amount of the dye represented by the formula (I) to be added to the photoconductive layer may be optionally set in a range not to significantly lower a concentration of the charge transfer material in the photoconductive layer. It is preferably from 0.1% to 10% by mass based on the total amount of a solid portion in the photoconductive layer.

Next, specific examples of compounds represented by the formula (II) to be used for the photoconductive layer of the present invention are shown below, however, the present invention is not limited to those examples.

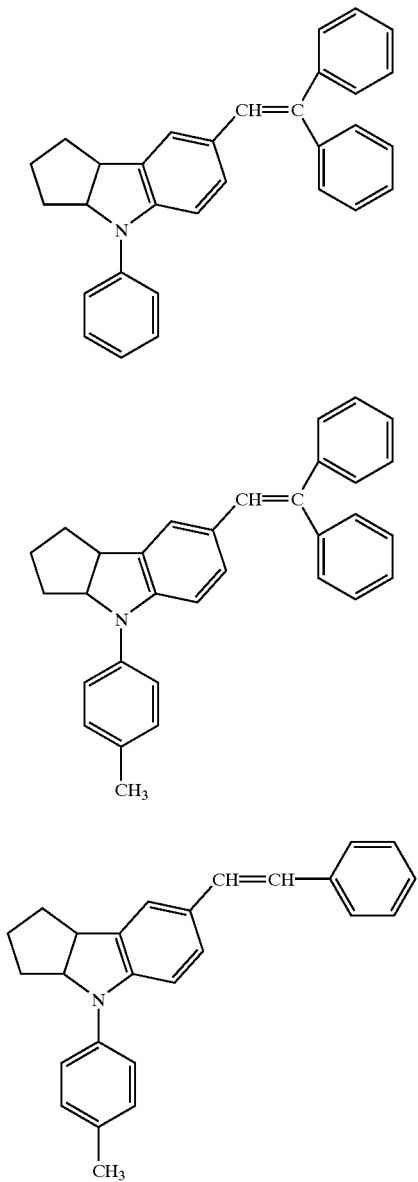

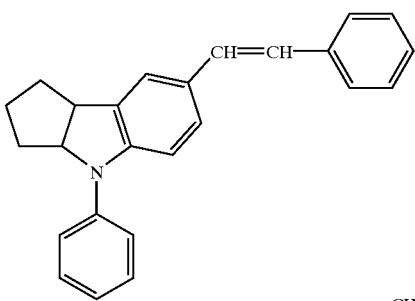

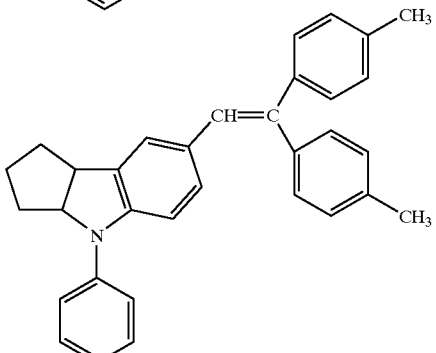

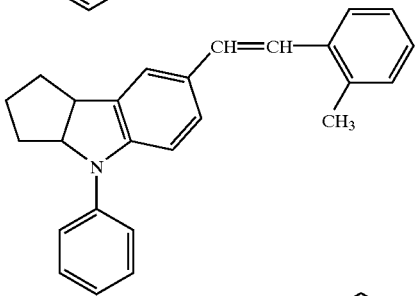

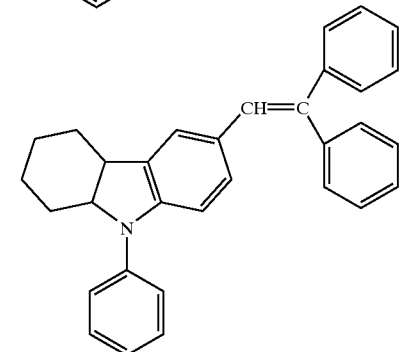

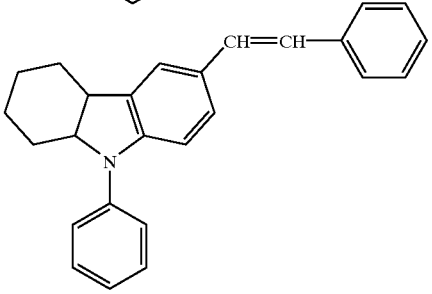

Next, specific examples of compounds represented by the formula (III) to be used for the photoconductive layer of the present invention are shown below, however, it is not limited to those examples.

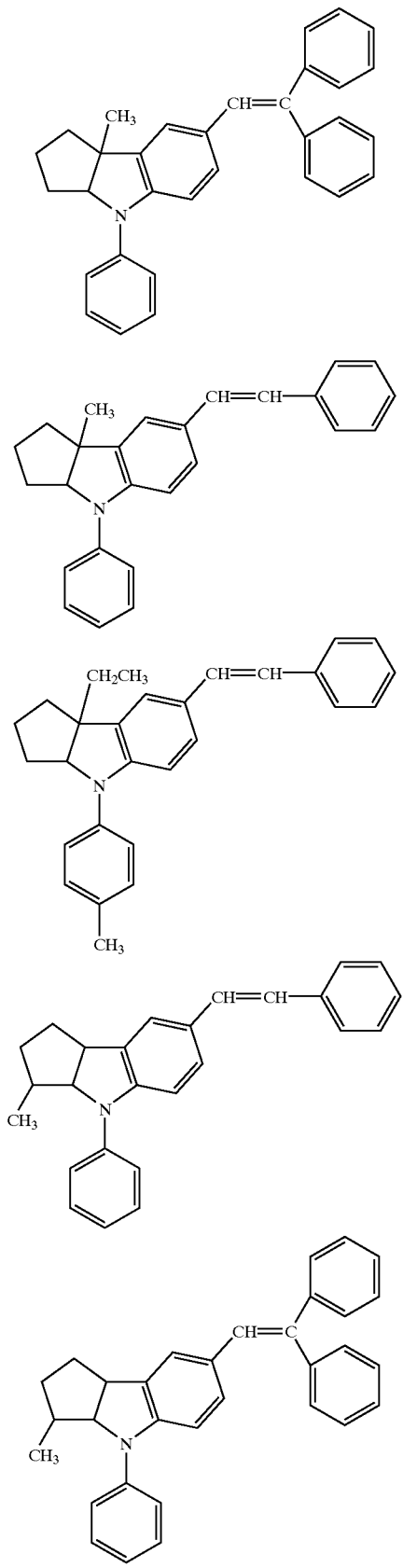
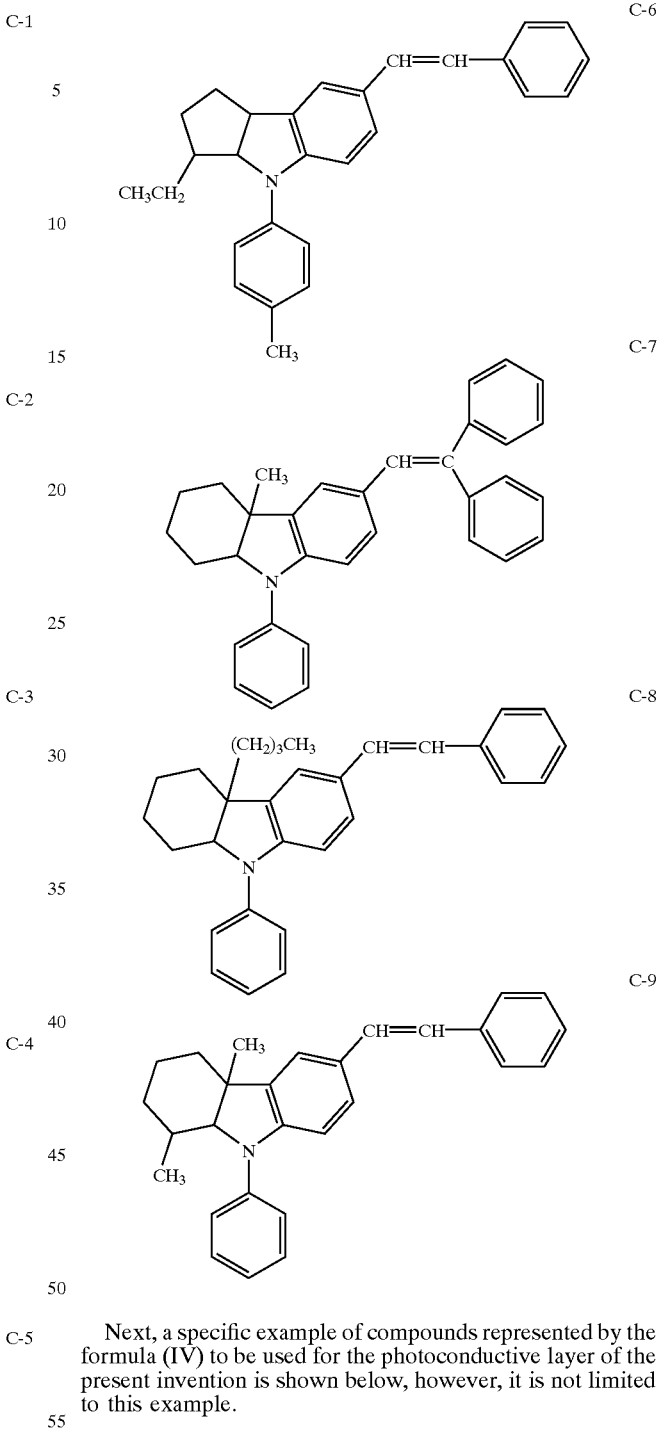
Next, a specific example of compounds represented by the formula (IV) to be used for the photoconductive layer of the present invention is shown below, however, it is not limited to this example.
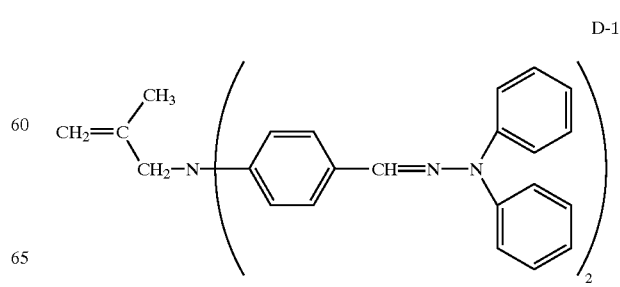

-continued

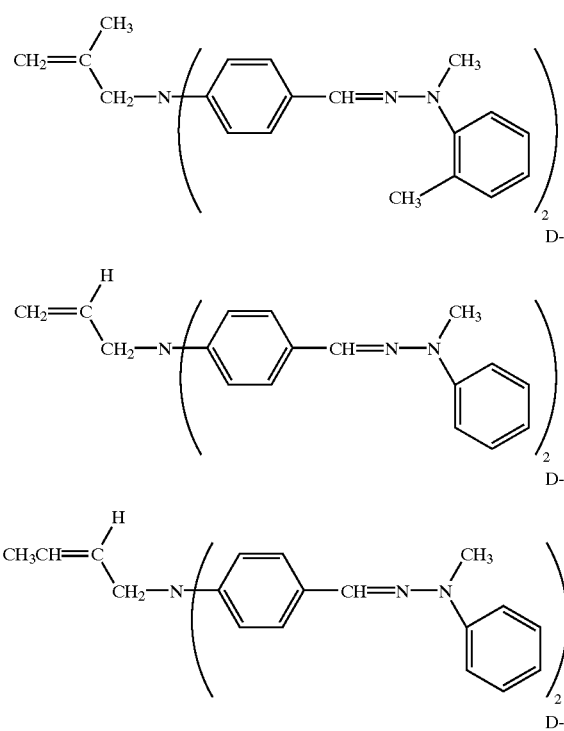

D-2

D-3

D-4

D-5

Next, specific examples of compounds represented by the formula (V) to be used for the photoconductive layer of the present invention are shown below, however, it is not limited to those examples.

E-1

E-2

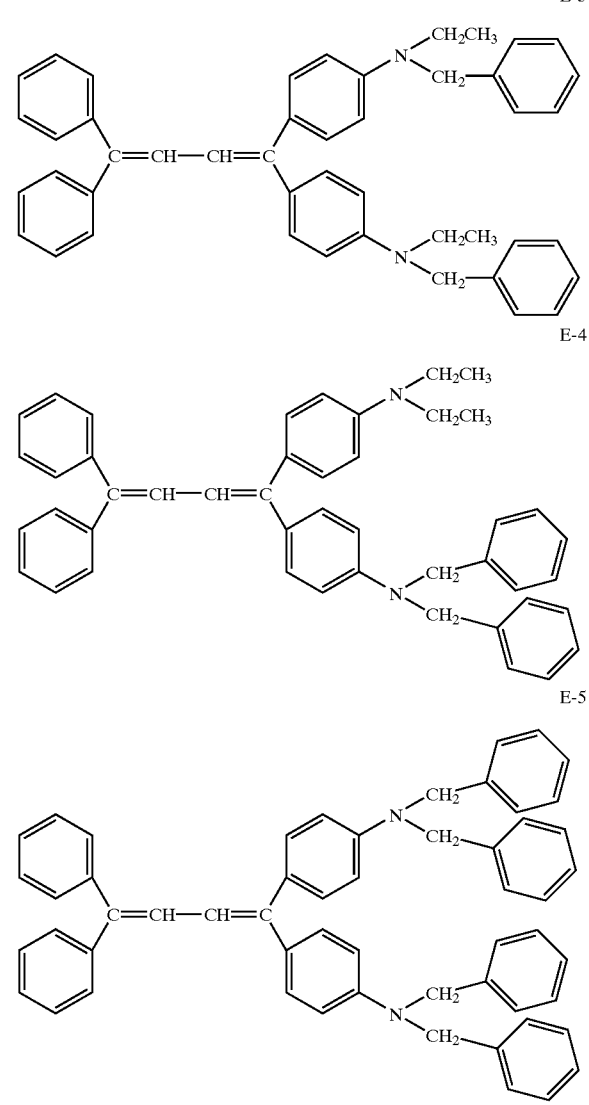

E-3

E-4

E-5

Next, a specific example of compound represented by the formula (VI) to be used for the photoconductive layer of the present invention is shown below, however, it is not limited to this example.

F-1

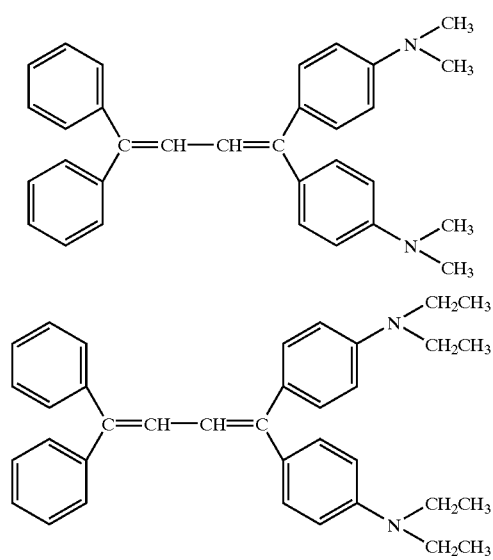

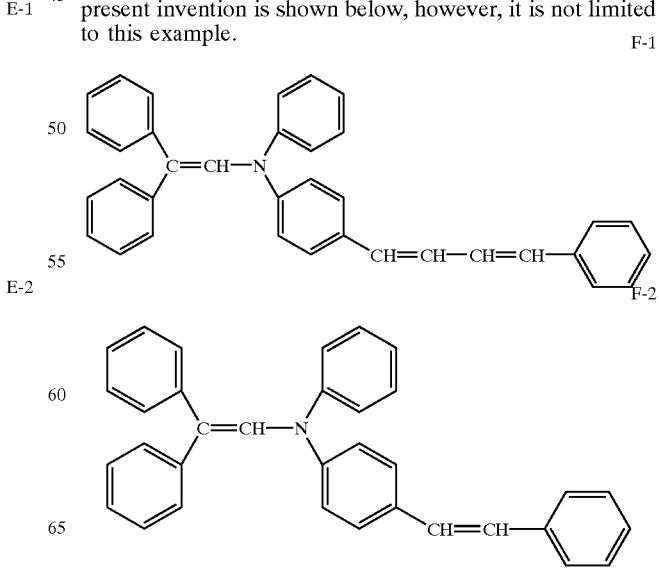

F-2

-continued

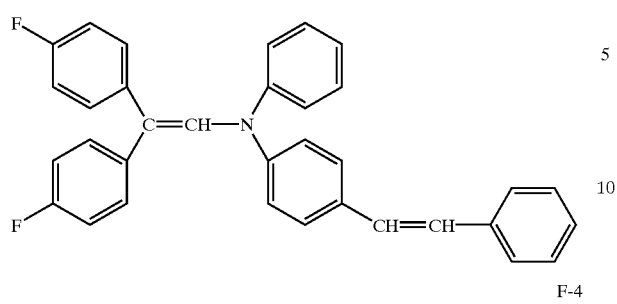
F-3

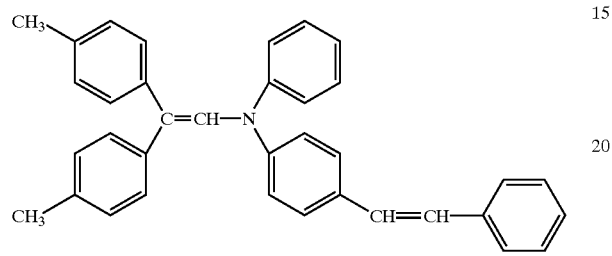
F-4

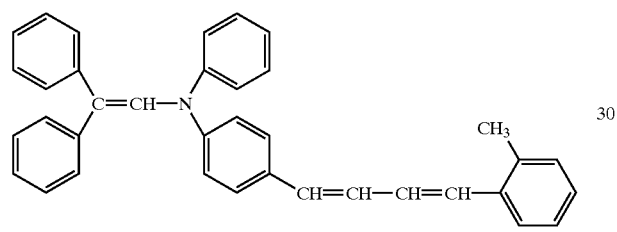
F-5

Next, a specific example of compound represented by the formula (VII) to be used for the photoconductive layer of the present invention is shown below, however, it is not limited to this example.

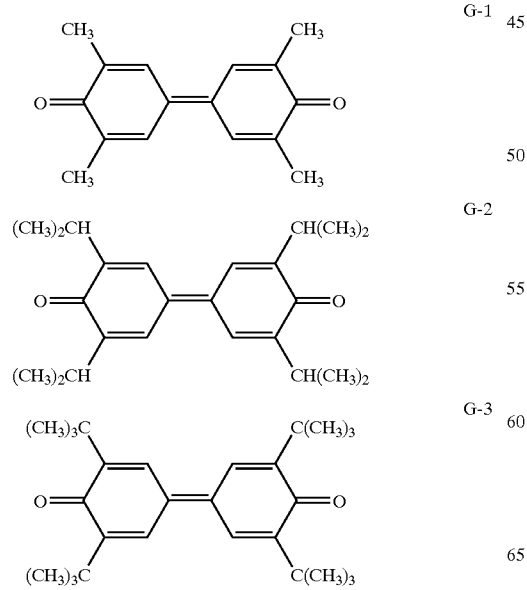
G-1

G-2

G-3

-continued

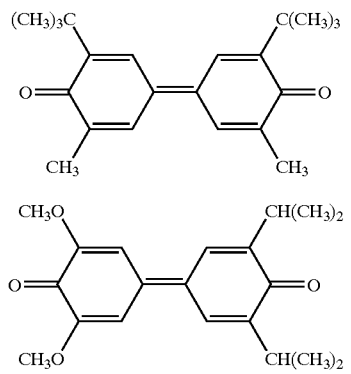
G-4

G-5

Next, specific examples of compounds represented by the formula (VIII) to be used for the photoconductive layer of the present invention are shown below, however, it is not limited to those examples.

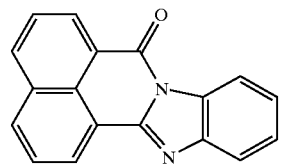
H-1

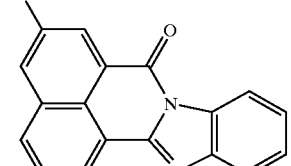
H-2

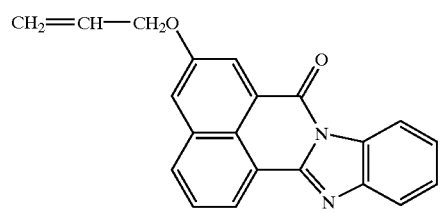
H-3

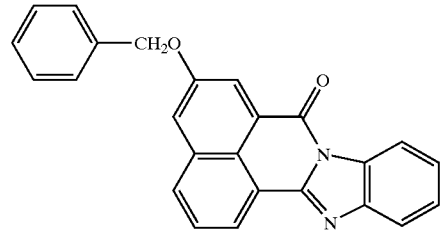
H-4

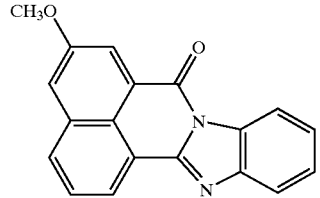
H-5

-continued
H-6
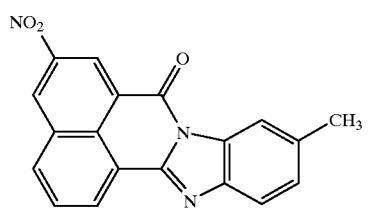
H-7
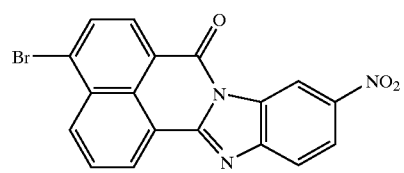
H-8
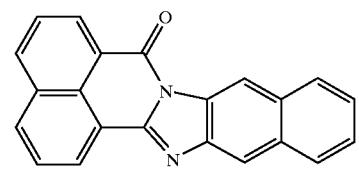
H-9
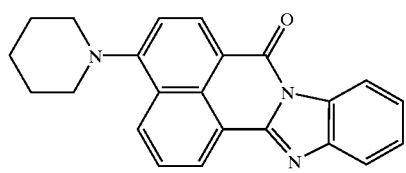
H-10
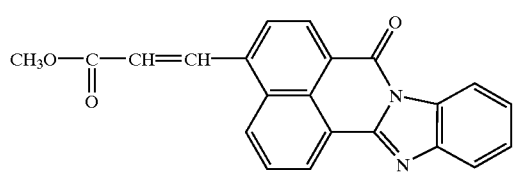
H-11
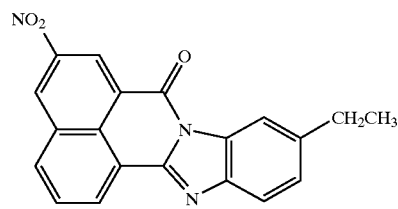
H-12
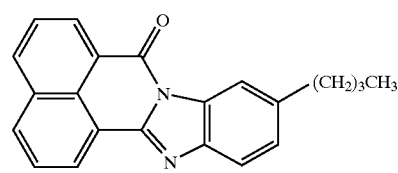
H-13
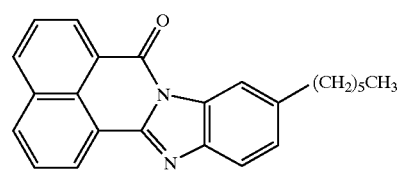
-continued
H-14
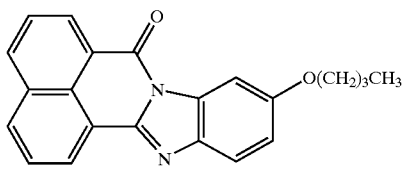
Next, a specific example of compound represented by the formula (IX) to be used for the photoconductive layer of the present invention is shown below, however, it is not limited to this example.
I-1
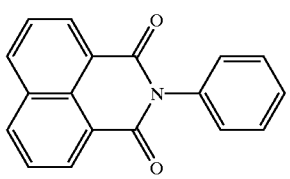
I-2
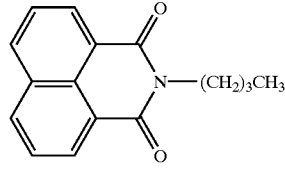
I-3
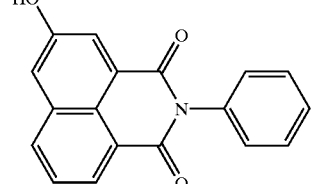
I-4
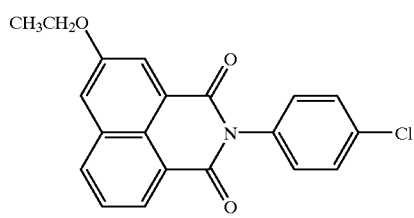
I-5
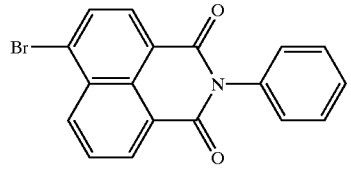
I-6
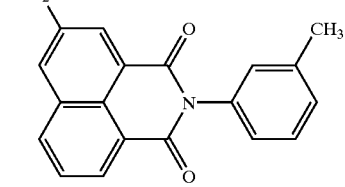
Next, a specific example of compound represented by the formula (X) to be used for the photoconductive layer of the present invention is shown below, however, it is not limited to this example.

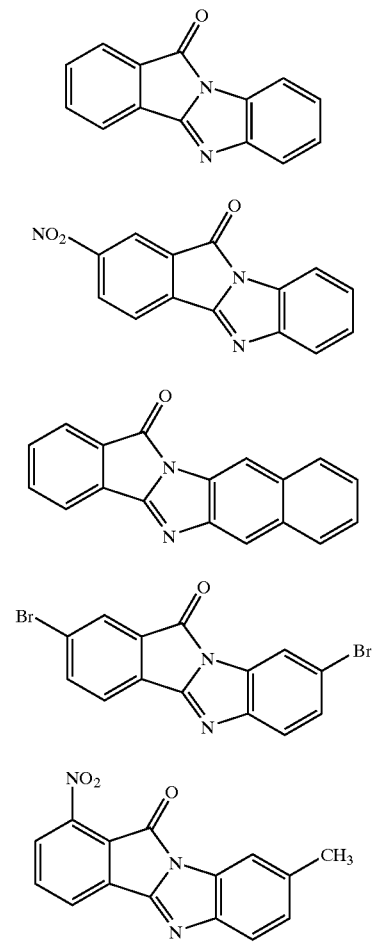

Next, a specific example of compound represented by the formula (XII) to be used for the photoconductive layer of the present invention is shown below, however, it is not limited to this example.

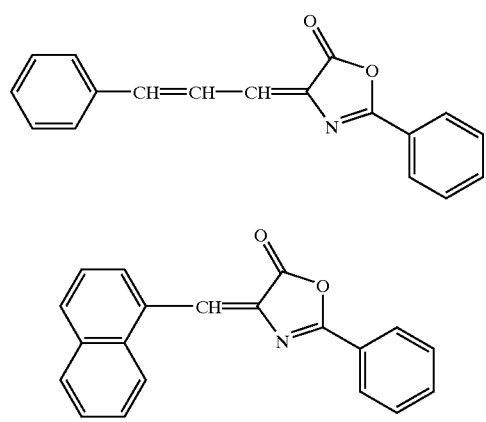

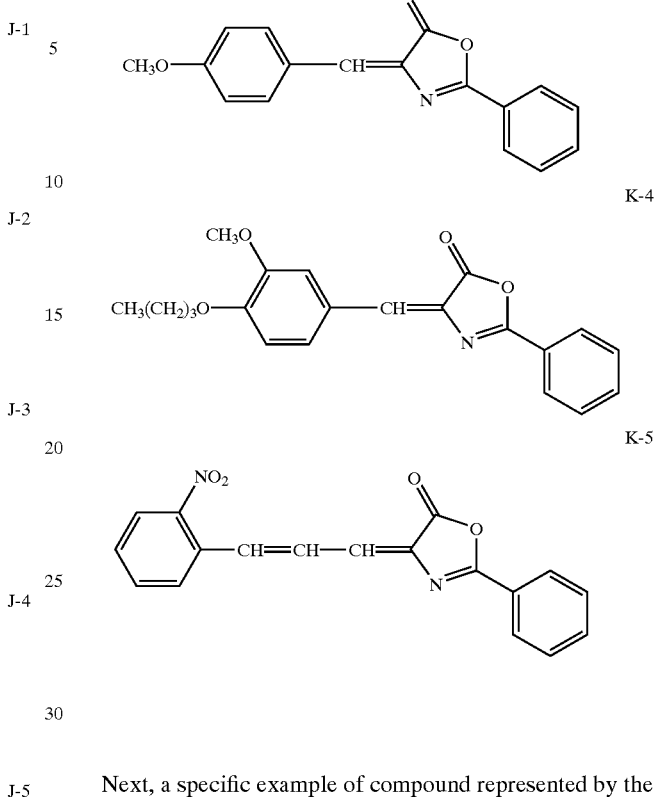

Next, a specific example of compound represented by the formula (XIII) to be used for the photoconductive layer of the present invention is shown below, however, it is not limited to this example.

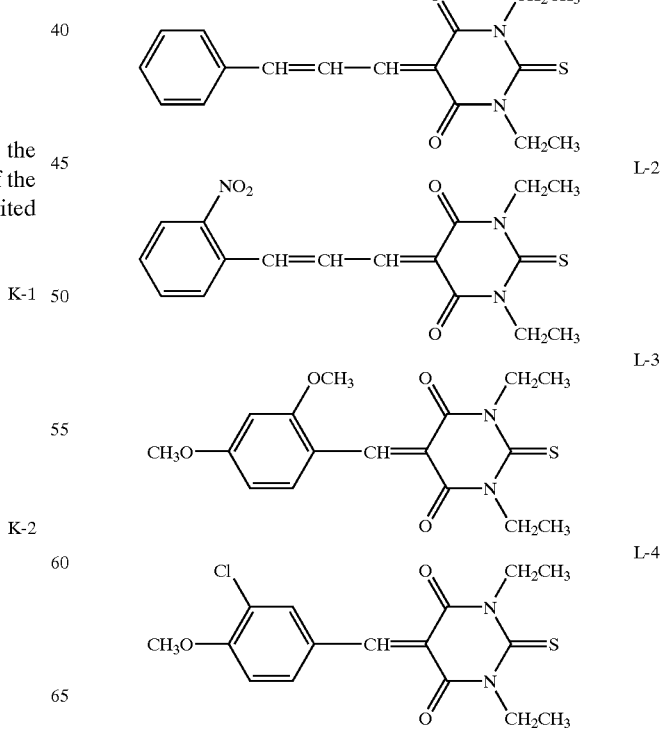

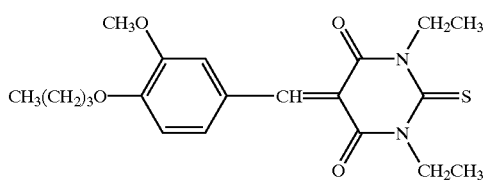

By adding compounds represented by the formulae (VII) to (XIII) in an amount of 0.1 to 30% by mass based on the total amount of the charge transfer materials represented by the formulae (II) to (VI), it is possible to further reduce a residual charge at an exposed portion as compared to a sample without being added compounds represented by the formulae (VII) to (XIII). The compounds represented by the formulae (VII) to (XIII) do not have spectrally sensitizing property, and therefore, it is possible to carry out formation of the electrostatic latent image and toner development under visible light or yellow safe light in a system where the compound of the formulae (VII) to (XIII) are added.

The action and mechanism for the effect caused by the compounds represented by the formulae (VII) to (XIII) are not clear in detail, however, it is assumed as follows. By exposing a photoconductive layer with UV light, the charge transfer materials of the formulae (II) to (VI) absorb the UV light and generate a large amount of electrons. As a result, the change in chargeability of the photoconductive layer is generated in the exposed portion of the photoconductive layer, and by charging followed by exposure, an unexposed portion is normally charged, while the exposed portion is selectively uncharged, thereby an electrostatic latent image is formed. Since the charge transfer materials of the formulae (II) to (VI) are excellent in positive charge transfer, but inferior in electron transfer, the difference in chargeability is easily lost by re-binding of the generated electrons and positive charges. The compounds of the formulae (VII) to (XIII) have a property of an electron acceptor, and they can temporarily accept the charges generated from the compounds of the formulae (II) to (VI) by irradiation of the UV light. Also, they are excellent in ability to transfer the electrons once accepted. Therefore, when charging is carried out after the UV light exposure, the electrons once accepted by the compounds of the formulae (VII) to (XIII) are released again by application of the electrical field, and the charges are favorably lost on the surface of the exposed portion by the UV light.

As a laminated board obtained by providing a metal conductive layer on an insulating substrate in accordance with the present invention, a typical one is that comprising paper-substrate phenol resin or a glass-substrate epoxy resin laminated by a copper film, etc. as a metal conductive layer. Examples of those laminated board are described in "Printed Circuit Technical Manual" (edited by Nippon Printed Circuit Industry Association, published by Nikkan Kogyo Shinbunsha in 1987), and desired laminated board can be used.

A thickness of the insulating substrate is generally from about 80 μm to about 3.2 mm, and the material and the thickness thereof are chosen according to the finally used embodiment as a printed wiring board. In case of using a thin substrate, it may be used by laminating several of them.

The metal conductive layer provided on the insulating substrate of the laminated board can be chosen from those having various thickness and those with a thickness of 5 to 35 μm is generally used. However, those having a thickness thinner or thicker than the above range may be used. As wiring density becomes higher and the width between the wiring becomes finer, it is more preferable to use a thinner metal conductive layer. As a metal used for the metal conductive layer, there may be mentioned copper, silver, aluminum, stainless, nichrome, tungsten, etc.

As specific examples of an alkali-soluble resin to be used in the photoconductive layer of the present invention, there may be mentioned styrene/maleic acid monoester copolymer, methacrylic acid/methacrylic acid ester copolymer, styrene/methacrylic acid/methacrylic acid ester copolymer, acrylic acid/methacrylic acid ester copolymer, styrene/acrylic acid/methacrylic acid ester copolymer, methacrylic acid/methacrylic acid ester/acrylic acid ester copolymer, acrylic acid/acrylic acid ester/methacrylic acid ester copolymer, vinyl acetate/crotonic acid copolymer, vinyl acetate/crotonic acid/methacrylic acid ester copolymer, styrene/vinyl benzoate copolymer or a phenol resin such as polyvinyl phenol resin, novolak resin, etc. As the resin to be used in the present invention, any resin can be used as long as it has a good film-forming property, is soluble for an aqueous alkali solution, and has a resistance against an etching solution to be used in removing the metal conductive layer, and it is not limited to the above-mentioned resins.

A mixing ratio of the charge transfer materials of the formulae (II) to (VI) to be used in the photoconductive layer of the present invention based on the binder resin is preferably about 0.1 to 100% by mass and particularly preferably 5 to 40% by mass.

Preparation of the photoconductive layer of the present invention is carried out by dip coating, bar-coating, spray-coating, roll-coating, spin-coating, electrodeposition, etc. A coating solution is prepared by dissolving components constituting the photoconductive layer in a proper solvent. Further, plasticizer, surfactant, and other additives can be added to the coating solution in addition to the charge transfer materials and the resin, for the purpose of improving physical properties of the film and viscosity of the coating solution.

As a solvent to be used for preparation of the coating solution, anything may be used as long as it can dissolve the charge transfer materials and the binder resins uniformly. Specifically, there may be mentioned alcohols such as methanol, ethanol, 1-propanol, 1-methoxy-2-propanol, etc.; ethers such as tetrahydrofuran (THF), 1,4-dioxane, 1,3-dioxolane, 1,2-dimethoxy ethane, ethylene glycol monomethyl ether, etc.; ketones such as acetone, methyl ethyl ketone, cyclohexanone, methyl isobutyl ketone, etc.; aromatic hydrocarbons such as toluene, xylene, etc.; esters such as ethyl acetate, methyl acetate, isobutyl acetate, etc.; amides such as N,N-di-methylformamide, N,N-dimethylacetamide, N-methylpyrrolidone, etc.; and dimethyl sulfoxide, etc., however, it is not limited to these, and it may be properly chosen according to a coating method and drying condition, etc. A concentration of the solid portion of the coating solution may also be properly chosen according to a coating method and drying condition, etc. Regarding a thickness of the photoconductive layer of the present invention, when it is too thick, problem arises that potential difference of an electrostatic latent image between the exposed portion and the unexposed portion is hard to be generated, and this promotes a deterioration of an dissolving solution in a process where the photoconductive layer is dissolved by alkali. On the other hand, if the photoconductive layer is too thin, it is impossible to give enough electric charge in a step of charging of the photoconductive layer required for toner developing of the electrophotography.

Preferred thickness of the photoconductive layer is 0.5 to 20 µm, and more preferably, 1 to 10 µm.

As a method for exposing the photosensitive material, there may be mentioned reflective image exposure, contact exposure through a transparent positive film, direct projection exposure, using UV fluorescent light, xenon lamp, high-pressure mercury vapor lamp, etc. as a light source, and scanning exposure using UV laser light. In case of using the scanning exposure, it can be carried out by changing a wavelength of laser light sources such as He—Ne laser, He—Cd laser, Argon laser, Krypton ion laser, ruby laser, YAG laser, nitrogen laser, dye laser, excimer laser, etc. with the second harmonic generation device to an appropriate wavelength according to light emitting wave length, or it can be carried out by using liquid crystal shutter and micro mirror array shutter.

After completing the image exposure, charging is carried out and a static latent image is formed. As a method for charging, there have been known a conventional non-contact charging such as corotron method and scorotron method, etc., and a contact charging method such as conductive roll-charging method, etc. Any method can be used as long as the photoconductive layer of the present invention in which its chargeability is changed by exposure can be charged uniformly.

An electrostatic latent image formed by statically charging process is developed by toner developing, and a toner image is formed. As a method for forming a toner image by electrophotographic method, there may be used a drying development (cascade development, magnetic brush development and powder crowd development) and a liquid development using a liquid toner in which toner particles are dispersed in a proper insulating solution. Among them, liquid development is more preferable for the present invention since toner particles are stable and have smaller particle diameters, thereby making it possible to form a finer toner image.

As a toner to be used in the present invention, there may be used a wet type toner used for an electrophotographic printing board, and it should show resistance against a removing of non-wiring portion of the photoconductive layer by dissolution in the following step. In view of this, as a component of the toner particle there is preferably contained, for example, an acrylic resin comprising an acrylate, a methacrylate, etc.; a vinyl acetate resin; copolymer of vinyl acetate and ethylene or vinyl chloride, etc.; a vinyl chloride resin; a vinylidene chloride resin; a vinyl acetal resin such as poly(vinyl butyral); polystyrene; copolymer of styrene and butadiene or a methacrylate, etc.; polyethylene, polypropylene and chlorides thereof; a polyester resin such as polyethylene terephthalate, polyethylene isophthalate, etc.; a polyamide resin such as polycapramide, polyhexamethylene adipamide, etc.; vinyl-modified alkyd resin; gelatin; a cellulose ester derivative such as carboxymethyl cellulose, etc.; and wax. Also, a dye or a charge controller may be added to the toner in the range which does not cause an unfavorable effect on development or fixing, etc. Moreover, the charge of the toner should be selected to be positive or negative based on statically charging polarity of the photoconductive layer upon corona charging.

As a method for development, there may be employed either reverse development method in which an exposed portion is developed while applying appropriate bias voltage, using toner having the same polarity as those of the electrostatic latent image, or normal development in which an unexposed portion is developed using toner particles having different polarity from those of the electrostatic latent image. The formed toner image can be fixed by, for example, heating fixation, pressure fixation, solvent fixation, etc. Using the thus formed toner image as a resist, the photoconductive layer is removed by dissolving solution to obtain a resist image of wiring which comprises a laminated board and provided thereon a photoconductive layer and the toner image.

As means for removing a portion of the photoconductive layer other than a toner image, a processor for a printing plate of non-image portion dissolving type may be basically employed using a dissolving solution. The dissolving solution to be used in the present invention contains a basic compound. For examples of the basic compound, there may be mentioned an inorganic basic compound such as an alkali silicate, an alkali hydroxide, an alkali phosphate, an alkali carbonate, ammonium phosphate, ammonium carbonate, etc., and an organic basic compound such as ethanolamines ethylenediamine, propanediamines, triethylenetetramine, morpholine, etc. The above-mentioned basic compounds may be used solely or as a mixture thereof. For a solvent of the dissolving solution, water is preferably used.

An exposed portion of the metal conductive layer other than the resist image of wiring is removed by etching. In an etching process, a method described in "Printed Circuit Technical Manual" (edited by Nippon Printed Circuit Industry Association, published by Nikkan Kogyo Shinbun-sha in 1987) maybe used. Any etching solution may be used so long as it can remove the metal conductive layer by dissolution and at least the photoconductive layer has a resistance against it. Generally, if a copper layer is employed for the metal conductive layer, an aqueous solution of ferric chloride, cupric chloride, etc. may be used.

As in the case of preparing a printed wiring board utilizing a general resist such as resist ink, liquid resist, dry film photo-resist, etc., a resist image of wiring portion can be removed after etching process, by treating with further more alkaline solution than that used in removal of the non-wiring portion. It is possible to use an organic solvent which dissolves a binder resin of the photosensitive layer, such as methyl ethyl ketone, dioxane, methanol, ethanol, propanol, etc.

EXAMPLES

In the following, the present invention is explained in more detail by referring to Examples, but the present invention is not limited by these Examples. In those Examples, part or % means part by mass and % by mass respectively, and a resin composition is represented by a mass ratio of monomers. Further, a sequence of the process at least from exposure to toner development and fixation was carried out in a room with a yellow safe light on, cutting the light with a wavelength shorter than 500 nm.

Example 1

A coating solution for forming a photoconductive layer was prepared based on the prescription 1 shown below and a both-surfaces copper-laminated board (available from Mitsubishi Gas Chemical Co., Inc., CCL-E170, trade name) was coated with the prepared coating solution on both surfaces by dip coating. This copper-clad laminated board coated with the photoconductive layer-forming solution was dried under heating at 120° C. for 30 minutes, to form a coating of the photoconductive layer with a thickness of 4 µm, thereby preparing a wiring board. Conformity of the pho toconductive layer to the unevenness of the copper layer was good.

TABLE 1

| Prescription 1 | Part |
|---|---|
| n-Butyl methacrylate/n-butyl acrylate/methacrylic acid = 4/3/3 copolymer (Molecular weight (Mw): 200,000) | 50 |
| Exemplified, compound B-4 | 5 |
| 1-Methoxy-2-propanol | 790 |

A film mask on which an image pattern had been drawn was placed on this photoconductive layer, and then, UV light exposure was carried out for 30 seconds by using a high pressure mercury light source apparatus for printing use with a means for suction attaching (available from Ushio Inc., UNIRECK URM 300, trade name). Subsequently, the wiring board was reversed and an unexposed surface was exposed for 30 seconds in the same manner, to generate a difference in static charge characteristics. Further, the photoconductive layer was compulsorily irradiated with a red laser diode sensor.

Next, using a corona statically charging device (charging voltage: +5.0 kV), both surfaces of the photoconductive layer was statically charged and surface potential was measured with respect to exposed portion by UV light and unexposed portion 1 minute after the completion of corona charging. It showed that an electric potential of the exposed portion was +100V, while that of the unexposed portion was +320V and it was confirmed that an electrostatic latent image was formed. Further, by using a positively charged toner (available from Mitsubishi Paper Mills, Ltd., "ODP-TW", trade name) for Mitsubishi OPC printing system, a reverse development was carried out by applying a bias voltage of +200V to the electrostatic latent image. The obtained toner image was fixed by heating at 70° C. for 10 minutes to obtain an excellent fixed image.

Using an aqueous solution of 1% sodium carbonate, a portion of the photoconductive layer other than the toner image was removed by dissolution to obtain a resist for a wiring portion. Further, using the residual toner image and the photoconductive layer as an etching resist, a copper layer was removed by etching by spraying a ferric chloride solution (available from Sunhayato Inc., H20L, trade name) heated at 45° C. and under spraying pressure of 2.5 kg/cm² for 2 minutes. Subsequently, the etching resist was removed by an aqueous solution of 3% sodium hydroxide and there were formed copper wirings with a line width of 50±2 μm, that is free from a trace of contact made with an exposing device or a mask film, etc., and free from fog caused by a red laser diode sensor, and further free from a pattern defect.

Example 2

A coating solution was prepared using an exemplified compound B-3 in place of B-4 in the prescription 1 of Example 1., and a wiring board, provided thereon, with a photoconductive layer was exposed on both surfaces in the same manner as in Example 1. Surface potential was measured with respect to exposed portion by UV light and unexposed portion 1 minute after the completion of corona charging. It showed that an electric potential of the exposed portion was +120V, while that of the unexposed portion was +320V and it was confirmed that an electric potential gap was formed. Further, the same treatments were carried out to prepare a wiring pattern, and there were formed copper wirings with a line width of 50±2 μm, that is free from a trace of contact made with an exposing device or a mask film, etc., and free from fog caused by a red laser diode sensor, and further free from a pattern defect.

Example 3

A coating solution was prepared based on the prescription 2 shown below and the same kind of the both-surfaces copper laminated board used in Example 1 was subjected dip coating in the same manner as in Example 1. It was dried under heating at 120° C. for 30 minutes, to form a photoconductive layer with a thickness of 8 μm, thereby preparing a wiring board. Conformity of the photoconductive layer was good.

TABLE 2

| Prescription 2 | Part |
|---|---|
| Copolymer; n-butyl methacrylate/n-butyl acrylate/methacrylic acid = 4/3/3 (Molecular weight: 200,000) | 920 |
| Exemplified compound B-4 | 125 |
| Exemplified compound H-1 | 13 |
| 1-methoxy-2-propanol | 4180 |

A film mask on which an image pattern had been drawn was placed on a photoconductive layer provided on a wiring board, and then, UV light exposure was carried out for 10 seconds by using a light box (available from Sunhayato Inc., Box-W 10, trade name) Next, using a corona statically charging device (charging voltage: +5.0 kV), the surfaces of the photoconductive layer was statically charged and surface potential was measured with respect to exposed portion by UV light and unexposed portion 1 minute after the completion of corona charging. The results are shown in Table 3. Further, in order to see the effect of additives, the surface potentials are also shown in Table 3 (Example 4) with respect to the exposed and the unexposed portion of the photoconductive layer prepared with a coating solution in which the exemplified compound H-1 of prescription 2 had not been added.

TABLE 3

| | Additive | Exposed portion potential | Unexposed portion potential |
|---|---|---|---|
| Example 3 | H-1 | 40 V | 300 V |
| Example 4 | none | 160 V | 300 V |

As is clear from Table 3, when the exemplified compound H-1 is added, the exposed portion had a lower electrically charged potential than that of the sample to which no additive was added, thereby increasing a potential gap between the exposed portion and the unexposed portion.

Examples 5 to 14

Based on prescription 2 of Example 3, a wiring board provided thereon a photoconductive layer in which various additives were added in place of the exemplified compound H-1 was used and evaluation was done in the same manner as in Example 3. The results are shown in Table 4.

TABLE 4

| | Additive | Exposed portion potential | Unexposed portion potential |
|---|---|---|---|
| Example 5 | G-2 | 80 V | 300 V |
| Example 6 | H-3 | 30 V | 300 V |
| Example 7 | H-4 | 40 V | 310 V |
| Example 8 | I-3 | 70 V | 310 V |

TABLE 4-continued

| | Additive | Exposed portion potential | Unexposed portion potential |
|---|---|---|---|
| Example 9 | J-1 | 80 V | 300 V |
| Example 10 | K-1 | 80 V | 300 V |
| Example 11 | K-2 | 70 V | 290 V |
| Example 12 | L-1 | 80 V | 300 V |
| Example 13 | L-3 | 90 V | 310 V |
| Example 14 | (XI) | 30 V | 300 V |

As is clear from Table 4, it is understood that the photoconductive layers with additives of the present invention showed smaller electrically charged potentials which resulted in a larger potential gap between the exposed and unexposed portions in all the cases.

Examples 15 to 25

A pattern circuit was prepared as described below using wiring boards of Example 3 and Examples 5 to 14. A film mask on which an image pattern had been drawn was placed on a photoconductive layer and UV light exposure was carried out for 10 seconds using a high pressure mercury light source apparatus for printing use with a means for suction attaching that was used in Example 1. Then, the wiring board was reversed and unexposed surface was exposed for 10 seconds in the same manner to introduce a difference in an electric charge characteristic on the both surfaces.

Next, using a corona statically charging device (charging voltage: +5.0 kV), both surfaces of the photoconductive layer was statically charged and using a positively charged toner used in Example 1, a reverse development was carried out by applying a bias voltage of +200V to obtain a toner image. The toner image was fixed by heating at 70° C. for 10 minutes to obtain a fixed image.

Using an aqueous solution of 1% sodium carbonate, a portion of the photoconductive layer other than the toner image was removed by dissolution to obtain a resist for a wiring portion. Further, using the residual toner image and the photoconductive layer as an etching resist, a copper layer was removed by etching by spraying a ferric chloride solution used in Example 1 heated at 45° C. and under spraying pressure of 2.5 kg/cm² for 2 minutes. Subsequently, the etching resist was removed by an aqueous solution of 3% sodium hydroxide. Evaluations on an image after toner fixation and status of copper wiring after etching the copper layer are shown in Table 5.

TABLE 5

| | Additives | Toner image after fixation (line width: 50 μm) | Circuit pattern after etching (line width) |
|---|---|---|---|
| Example 15 | H-1 | No defect | 50 ± 3 μm |
| Example 16 | G-2 | No defect | 50 ± 3 μm |
| Example 17 | H-3 | No defect | 50 ± 3 μm |
| Example 18 | H-4 | No defect | 50 ± 3 μm |
| Example 19 | I-3 | No defect | 50 ± 3 μm |
| Example 20 | J-1 | No defect | 50 ± 3 μm |
| Example 21 | K-1 | No defect | 50 ± 3 μm |
| Example 22 | K-2 | No defect | 50 ± 3 μm |
| Example 23 | L-1 | No defect | 50 ± 3 μm |
| Example 24 | L-3 | No defect | 50 ± 3 μm |
| Example 25 | (XI) | No defect | 50 ± 3 μm |

As is clear from Table 5, it is shown that those using additives can provide copper wiring including fine wiring with a line width of 50±3 μm on the both surfaces.

Comparative Examples 1 to 6

Using a wiring board on which a photoconductive layer was provided containing various kinds of comparative compounds in place of the exemplified compound B-4 in prescription 2 of Example 3, evaluation was made on sensitivity by the same treatment as in Example 3. The results are shown in Table 6.

TABLE 6

| | Charge transfer material | Additive | Exposed portion potential | Unexposed portion potential |
|---|---|---|---|---|
| Comparative example 1 | P | H-1 | 250 V | 300 V |
| Comparative example 2 | Q | H-1 | 260 V | 300 V |
| Comparative example 3 | R | H-1 | 250 V | 310 V |
| Comparative example 4 | P | none | 290 V | 310 V |
| Comparative example 5 | Q | none | 300 V | 300 V |
| Comparative example 6 | R | none | 290 V | 300 V |

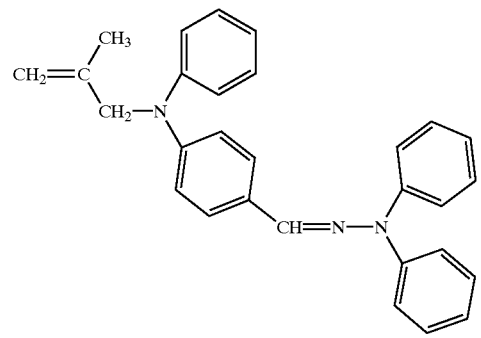

Comparative compound P

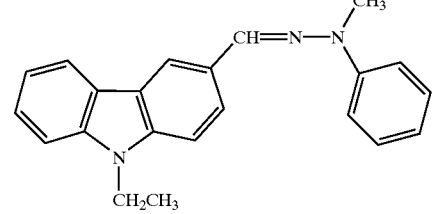

Comparative compound Q

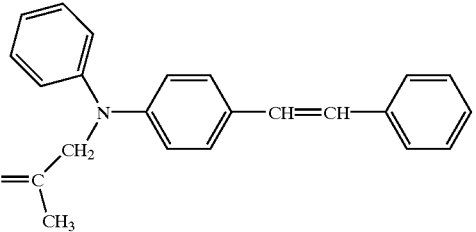

Comparative compound R

As is clear from Table 6, when comparative compounds P, Q and R were used, it is shown that loss of electric potential at exposed surface was small, and that sensitivity of the photoconductive layer for a light with a wavelength shorter than 500 nm was small. In addition, when the additives were not used, it was shown that loss of electric potential at exposed surface was extremely small, and that there was practically no sensitivity of the photoconductive layer for a light with a wavelength shorter than 500 nm.

Example 26

A both-surfaces copper-laminated board used in Example 1 was coated with a coating solution based on the prescription 3 shown below by dip coating. It was dried under heating at 120° C. for 30 minutes, to form a photoconductive layer with a thickness of 4 µm, thereby preparing a wiring board. Conformity of the photoconductive layer was good.

TABLE 7

| Prescription 3 | Part |
| --- | --- |
| n-Butyl methacrylate/n-butyl acrylate/methacrylic acid = 4/3/3 copolymer (Molecular weight (Mw): 200,000) | 2300 |
| Exemplified compound A-3 | 50 |
| Exemplified compound B-4 | 200 |
| Exemplified compound H-1 | 10 |
| 1,3-Dioxolane | 1250 |
| 1-Methoxy-2-propanol | 6200 |

A film mask on which an image pattern had been drawn was placed on this photoconductive layer, and then, UV light exposure was carried out for 20 seconds by using a high pressure mercury light source apparatus for printing use with a means for suction attaching used in Example 1. Subsequently, the wiring board is reversed and an unexposed surface was exposed for 20 seconds in the same manner, to generate a difference in static charge characteristics. Further, the photoconductive layer was irradiated with a red laser diode sensor.

Next, using a corona statically charging device (charging voltage: +5.0 kV), both surfaces of the photoconductive layer was statically charged and surface potential was measured with respect to exposed portion by UV light and unexposed portion 1 minute after the completion of corona charging. It showed that an electric potential of the exposed portion was +20V, while that of the unexposed portion was +250V and it was confirmed that an electrostatic latent image was formed. Further, by using a positively charged toner used in Example 1, a reverse development was carried out by applying a bias voltage of +200V. The obtained toner image was fixed by heating at 70° C. for 10 minutes to obtain an excellent fixed image.

Using an aqueous solution of 1% sodium carbonate, a portion of the photoconductive layer other than the toner image was removed by dissolution to obtain a resist for a wiring portion comprising a toner image and the photoconductive layer. Circuit pattern was colored blue and it was easy to optically observe a circuit pattern. Further, using the residual toner image and the photoconductive layer as an etching resist, a copper layer was removed by etching by spraying a ferric chloride solution used in Example 1 heated at 45° C. and under spraying pressure of 2.5 kg/cm² for 2 minutes. Subsequently, the etching resist was removed by an aqueous solution of 3% sodium hydroxide and there were formed copper wirings with a line width of 50±2 µm, that is free from a trace of contact made with an exposing device or a mask film, etc., and free from fog caused by a red laser diode sensor, and further free from a pattern defect.

Examples 27 to 31

Using a wiring board on which a photoconductive layer was provided containing various kinds of comparative compounds in place of the exemplified compound B-4 in prescription 1 of Example 1, evaluation was made on sensitivity in the same manner and preparation of a circuit pattern was carried out. The results for sensitivity are shown in Table 8 and evaluations for circuit pattern is shown in Table 9.

TABLE 8

| | Exemplified compound | Exposed portion potential | Unexposed portion potential |
| --- | --- | --- | --- |
| Example 27 | B-6 | 90 V | 350 V |
| Example 28 | C-2 | 110 V | 330 V |
| Example 29 | D-1 | 100 V | 320 V |
| Example 30 | E-2 | 120 V | 350 V |
| Example 31 | F-1 | 110 V | 340 V |

TABLE 9

| | Exemplified compound | Toner circuit pattern (line width: 50 µm) | Circuit pattern after etching (line width) |
| --- | --- | --- | --- |
| Example 27 | B-6 | No defect | 50 ± 3 µm |
| Example 28 | C-2 | No defect | 50 ± 3 µm |
| Example 29 | D-1 | No defect | 50 ± 3 µm |
| Example 30 | E-2 | No defect | 50 ± 3 µm |
| Example 31 | F-1 | No defect | 50 ± 3 µm |

As is clear from Table 8, it was shown that an electrostatic latent image was formed by ensuring potential difference between the exposed portion and the unexposed portion. Also as is clear from Table 9, it was shown that patterns without defect were formed.

Example 32

A coating solution was prepared based on the prescription 4 shown below and the same kind of a both-surfaces copper laminated board used in Example 1 was coated with the prepared coating solution on both surfaces by dip coating. This was dried under heating at 120° C. for 30 minutes, to prepare a wiring board with a photoconductive layer having a thickness of 8 µm. Conformity of the photoconductive layer was good.

TABLE 10

| Prescription 4 | Part |
| --- | --- |
| n-Butyl methacrylate/n-butyl acrylate/methacrylic acid = 4/3/3 copolymer (Molecular weight (Mw): 200,000) | 2200 |
| Exemplified compound A-4 | 50 |
| Exemplified compound B-4 | 300 |
| Exemplified compound H-1 | 15 |
| 1,3-Dioxolane | 1250 |
| 1-Methoxy-2-propanol | 6200 |

A film mask on which an image pattern had been drawn was placed on this photoconductive layer of the wiring board, and then, UV light exposure was carried out for 10 seconds by using a light box used in Example 3. Subsequently, using a corona statically charging device (charging voltage: +5.0 kV), surface of the photoconductive layer was statically charged and surface potential was measured with respect to exposed portion by UV light and unexposed portion 1 minute after the completion of corona charging. The results are shown in Table 11. Further, in order to see an effect of the additives, surface potentials of exposed and unexposed portions of the photoconductive layer prepared with a coating solution based on prescription 4 with out adding the exemplified compound H-1 are shown together (Example 33).

TABLE 11

| | Additive | Exposed portion potential | Unexposed portion potential |
|---|---|---|---|
| Example 32 | H-1 | 40 V | 300 V |
| Example 33 | none | 160 V | 300 V |

As is clear from Table 11, the electric potential at exposed portion was smaller when the exemplified compound H-1 had been added to a coating solution compared to that without the additive. As a result, it was shown that a potential gap became large between the exposed and unexposed portions.

Example 34

Using the wiring board prepared in Example 32, a pattern circuit was prepared as follows. A film mask on which an image pattern had been drawn was placed on this photoconductive layer, and then, UV light exposure was carried out for 10 seconds by using a high pressure mercury light source apparatus for printing use with a means for suction attaching used in Example 1. Subsequently, the wiring board is reversed and an unexposed surface was exposed for 10 seconds in the same manner, to generate a difference in static charge characteristics.

Next, using a corona statically charging device (charging voltage: +5.0 kV), both surfaces of the photoconductive layer were statically charged, and then, by using a positively charged toner used in Example 1, a reverse development was carried out by applying a bias voltage of +200V to obtain a toner image. The obtained toner image was fixed by heating at 70° C. for 10 minutes to obtain a fixed image.

Using an aqueous solution of 1% sodium carbonate, a portion of the photoconductive layer other than the toner image was removed by dissolution to obtain a resist for a wiring portion. The circuit pattern was colored blue and it was easy to optically observe it. Further, using the residual toner image and the photoconductive layer as an etching resist, a copper layer was removed by etching by spraying a ferric chloride solution used in Example 1, heated at 45° C. and under spraying pressure of 2.5 kg/cm$^2$ for 2 minutes. Subsequently, the etching resist was removed by an aqueous solution of 3% sodium hydroxide. Evaluations on image after toner fixing and status of copper wiring after etching of the copper layer are shown in Table 12.

TABLE 12

| | Toner circuit pattern after fixation (line width: 50 μm) | Circuit pattern after etching (line width) |
|---|---|---|
| Front surface | No defect | 50 ± 3 μm |
| Back surface | No defect | 50 ± 3 μm |

Example 35

A coating solution was prepared based on the prescription 4 of Example 32, and a portion thereof was kept and sealed in a non-transparent polyethylene container and preserved under heating at 50° C. for 30 days. Using this coating solution after preserved, the same kind of both-surface copper-clad laminated board used in Example 1 was coated by wire-bar coating. It was dried under heating at 120° C. for 30 minutes, to prepare a wiring board with a photoconductive layer having a thickness of 8 μm. Conformity of the photoconductive layer to unevenness of the copper layer was good.

A film mask on which an image pattern had been drawn was placed on this photoconductive layer of the wiring board, and then, UV light exposure was carried out for 10 seconds by using a light box used in Example 3. Subsequently, using a corona statically charging device (charging voltage: +5.0 kV), surface of the photoconductive layer was statically charged and surface potential was measured with respect to exposed portion by UV light and unexposed portion 1 minute after the completion of corona charging. The results are shown in Table 13. Further, surface potentials of exposed and unexposed portions of the photoconductive layer prepared with a coating solution immediately after preparation are also shown.

TABLE 13

| | Exposed portion potential | Unexposed portion potential |
|---|---|---|
| Product coated after heated preservation | 60 V | 300 V |
| Product coated immediately after preparation | 40 V | 300 V |

As is clear from Table 13, even after the coating solution was kept under heating at 50° C. for 30 days, it was shown that loss in photosensitivity of the photoconductive layer was small.

Example 36

A coating solution was prepared based on the prescription 4 of Example 32, and replacing the exemplified compound A-4 by A-3, and using this solution, a wiring board was prepared as in the same manner in Example 32, and evaluation was made in the same manner as in Example 35. The results are shown in Table 14. In addition, surface potentials of exposed and unexposed portions of the photoconductive layer prepared with a coating solution immediately after preparation are also shown.

TABLE 14

| | Exposed portion potential | Unexposed portion potential |
|---|---|---|
| Product coated after heated preservation | 65 V | 300 V |
| Product coated immediately after preparation | 50 V | 300 V |

As is clear from Table 14, even after the coating solution was kept under heating at 50° C. for 30 days, it was shown that loss in photosensitivity of the photoconductive layer was small.

Example 37

A coating solution was prepared based on the prescription 4 of Example 32, without adding the exemplified compound A-4, and using this solution, a wiring board was prepared as in the same manner in Example 32, and evaluation was made in the same manner as in Example 35. The results are shown in Table 15. In addition, surface potentials of exposed and unexposed portions of the photoconductive layer prepared with a coating solution immediately after preparation are also shown.

TABLE 15

|  | Exposed portion potential | Unexposed portion potential |
|---|---|---|
| Product coated after heated preservation | 200 V | 300 V |
| Product coated immediately after preparation | 40 V | 300 V |

As is clear from Table 15, it was shown that when a coating solution was prepared without being added the exemplified compound A-4, a photosensitivity of the photoconductive layer was greatly lost after the coating solution was kept under heating at 50° C. for 30 days.

Comparative Examples 7 to 11

A photoconductive layer was prepared based on the prescription 4 of Example 32, replacing the exemplified compound A-4 with various kinds of comparative dyes, and a wiring pattern was obtained in the same manner as in Example 34. After toner fixing, a circuit resist was formed by alkali dissolution, and evaluations are made on circuit pattern (line width 50 μm). Surface potentials were also measured with respect to exposed and unexposed portions before toner fixing. The results are shown in Table 16.

Comparative compound S

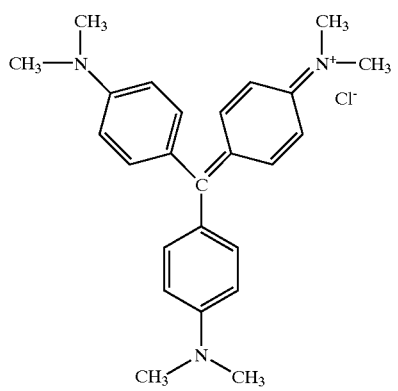

Comparative compound T

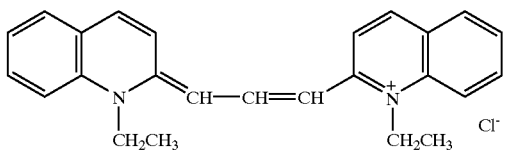

Comparative compound U

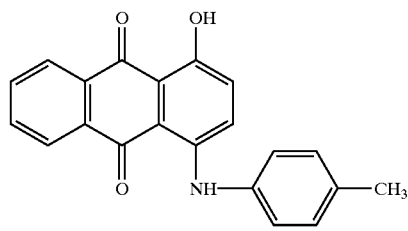

Comparative compound W

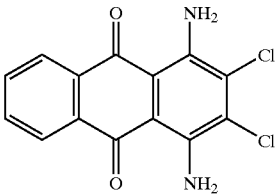

ORASOL BLUE GL Comparative Compound N (manufactured by Ciba Specialty Chemicals Co.: phthalocyanine dye)

TABLE 16

|  |  | Surface potential Before toner development | |
|---|---|---|---|
| Comparative dye | Toner circuit pattern | Exposed portion | Unexposed portion |
| Comparative example 7 | S | Indistinct (purple) | 50 V | 50 V |
| Comparative example 8 | T | Indistinct (blue) | 50 V | 50 V |
| Comparative example 9 | U | Indistinct (purple) | 30 V | 80 V |
| Comparative example 10 | W | Indistinct (purple) | 40 V | 80 V |
| Comparative example 11 | N | Indistinct (purple) | 5 V | 5 V |

Dyes used in Comparative examples 7 and 8 were cationic dyes, and it can be understood that ion-conductivities of the photoconductive layers were high and formation of an electrostatic latent image good enough for a practical use could not be carried out. In comparative Examples 9 and 10, an electrostatic latent image was formed, however, with a bias voltage of +200V, it was impossible to form a pattern since toner was attached on entire surface. Potential differences between the exposed and unexposed portions were 40 to 50V, and it was difficult to form a toner pattern that is functional enough for a resist even though the bias voltage is regulated. In Comparative example 11, phthalocyanine dye was used that itself has a photoconductivity. Therefore, photo-carrier was generated in the photoconductive layer under visible light condition, and an electrostatic latent image was not formed.

Example 38

Using a coating solution prepared based on prescription 5 shown below, the same kind of both-surface copper-clad laminated board used in Example 1 was coated on the both surfaces by dip coating. It was dried under heating at 120° C. for 30 minutes, to prepare a wiring board with a photoconductive layer having a thickness of 8 um. Conformity of the photoconductive layer to unevenness of the copper layer was good.

TABLE 17

| Prescription 5 | Part |
|---|---|
| n-Butyl methacrylate/n-butyl acrylate/ methacrylic acid = 4/3/3 copolymer (Molecular weight (Mw): 200,000) | 920 |
| Exemplified compound A-3 | 31 |

TABLE 17-continued

| Prescription 5 | Part |
| --- | --- |
| Exemplified compound C-2 | 125 |
| Exemplified compound H-1 | 13 |
| 1,3-Dioxolane | 700 |
| 1-Methoxy-2-propanol | 3480 |

A film mask on which an image pattern had been drawn was placed on a photoconductive layer provided on a wiring board, and then, UV light exposure was carried out for 10 seconds by using a light box used in Example 3. Next, using a corona statically charging device (charging voltage: +5.0 kV), the surfaces of the photoconductive layer was statically charged to obtain an electrostatic latent image. Then, by using a positively charged toner used in Example 1, a reverse development was carried out by applying a bias voltage of +250V to obtain a toner image. The obtained toner image was fixed by heating at 70° C. for 10 minutes. On the photoconductive layer, there was formed a circuit pattern with a line width of 50 μm by toner that was free from defects such as shortening of a line, etc.

Using an aqueous solution of 1% sodium carbonate, a portion of the photoconductive layer other than the toner image was removed by dissolution to obtain a resist for a wiring portion. The circuit pattern was colored blue and it was easy to optically observe it. Further, using the residual toner image and the photoconductive layer as an etching resist, a copper layer was removed by etching by spraying a ferric chloride solution used in Example 1, heated at 45° C. and under spraying pressure of 2.5 kg/cm² for 2 minutes. Subsequently, the etching resist was removed by an aqueous solution of 10% sodium hydroxide, whereby a copper circuit was formed with a line width of 50±2 μm and free of pattern defect.

On the other hand, to evaluate photosensitivity of the photoconductive layer, surface potentials were measured at the exposed portion by UV light and at the unexposed portion after 1 minute from completion of corona charging. The results are shown in Table 18. Further, in order to see an effect of the additives, surface potentials at the exposed and unexposed portion of the photoconductive layer prepared by a coating solution of prescription 5 without adding the exemplified compound H-1 are also shown (as Example 39).

TABLE 18

| | Additive | Exposed portion potential | Unexposed portion potential |
| --- | --- | --- | --- |
| Example 38 | H-1 | 40 V | 310 V |
| Example 39 | none | 150 V | 310 V |

As is clear from Table 18, it was shown that a potential at the exposed portion was decreased greatly by addition of the exemplified compound H-1, compared to a case without adding it.

Examples 40 to 45

Using a coating solution prepared based on the prescription 5 of Example 38, where the exemplified compound C-2 and H-1 were replaced by various kinds of additives, the photoconductive layer was prepared to obtain a wiring board. Using the same, evaluation was made in the same manner as in Example 38. In order to evaluate photosensitivity, surface potentials on the exposed and unexposed portion were measured. The results of potential measurement and reproducibility of a circuit pattern after etching of the copper layer are shown in Table 19.

TABLE 19

| | Compound C | Compound H | Exposed portion potential | Unexposed portion potential | Circuit pattern after etching |
| --- | --- | --- | --- | --- | --- |
| Example 40 | C-3 | H-1 | 50 V | 300 V | Good reproducibility |
| Example 41 | C-8 | H-3 | 60 V | 310 V | Good reproducibility |
| Example 42 | C-9 | H-3 | 60 V | 310 V | Good reproducibility |
| Example 43 | C-3 | H-4 | 50 V | 310 V | Good reproducibility |
| Example 44 | C-8 | H-12 | 80 V | 300 V | Good reproducibility |
| Example 45 | C-9 | H-12 | 80 V | 300 V | Good reproducibility |

Examples 46

Using a wiring board prepared in Example 38, a film mask on which an image pattern had been drawn was placed on a photoconductive layer thereof, and then, UV light exposure was carried out for 20 seconds by using a high pressure mercury light source apparatus for printing use with a means for suction attaching used in Example 1. Further, the wiring board was reversed and unexposed surface was exposed for 20 seconds in the same manner to generate a difference in a statically charging property on both surfaces.

Next, after the surfaces of the photoconductive layer was statically charged by a corona statically charging device (charging voltage: +5.0 kV), surface potentials were measured at both exposed and unexposed portion after 1 minute from completion of corona charging, and it was shown that potential at exposed portion was +40V and at unexposed, +310V, thereby forming static latent images on both surfaces then, by using a positively charged toner used in Example 1, a reverse development was carried out by applying a bias voltage of +200V to obtain toner images on both surfaces. The obtained toner images were fixed by heating at 70° C. for 10 minutes to obtain excellent fixed images.

Using an aqueous solution of 1% sodium carbonate, a portion of the photoconductive layer other than the toner image was removed by dissolution to obtain resists for wiring portions on the both surfaces which were colored blue and comprised the toner image and the photoconductive layer. Further, using the residual toner image and the photoconductive layer as an etching resist, a copper layer was removed by etching by spraying a ferric chloride solution used in Example 1, heated at 45° C. and under spraying pressure of 2.5 kg/cm² for 2 minutes. Subsequently, the etching resist was removed by an aqueous solution of 3% sodium hydroxide, whereby copper circuits were formed on the both surfaces with a line width of 50±2 μm and that were free from a trace of contact made with an exposing device or a mask film, etc. and a pattern defect.

Example 47

Using a wiring board prepared in Example 38, a film mask on which an image pattern had been drawn was placed on a photoconductive layer thereof, and then, UV light exposure was carried out for 20 seconds by using a high pressure mercury light source apparatus for printing use with a means for suction attaching used in Example 1. Further, the wiring board was reversed and unexposed surface was exposed for 20 seconds in the same manner to generate a difference in a statically charging property on both surfaces.

For the next 15 minutes from completion of the exposure on both surfaces of the photoconductive layer, the wiring board was left alone. Then, after the both surfaces of the photoconductive layers were statically charged by a corona statically charging device (charging voltage: +5.0 kV), surface potentials were measured at both exposed and unexposed portion after 1 minute from completion of corona charging, and it was shown that potential at exposed portion was +40 V and at unexposed, +310 V, thereby forming static latent images on both surfaces then, by using a positively charged toner used in Example 1, a reverse development was carried out by applying a bias voltage of +200 V to obtain toner images on both surfaces. The obtained toner images were fixed by heating at 70° C. for 10 minutes to obtain excellent fixed images.

Using an aqueous solution of 1% sodium carbonate, a portion of the photoconductive layer other than the toner image was removed by dissolution to obtain resists for wiring portions on the both surfaces which were colored blue and comprised the toner image and the photoconductive layer. Further, using the residual toner image and the photoconductive layer as an etching resist, a copper layer was removed by etching by spraying a ferric chloride solution used in Example 1, heated at 45° C. and under spraying pressure of 2.5 kg/cm$^2$ for 2 minutes. Subsequently, the etching resist was removed by an aqueous solution of 3% sodium hydroxide, whereby copper circuits were formed on the both surfaces with a line width of 50±2 $\mu$m and that were free from a trace of contact made with an exposing device or a mask film, etc. and a pattern defect. It was also shown that even in the case there were 15 minute time lag between UV exposure step and statically charging step, favorable pattern was able to be formed.

Comparative Example 12

Using a wiring board prepared in Example 38, and after statically charging one surface a corona statically charging device (charging voltage: +5.0 kV), a film mask on which an image pattern had been drawn was placed on this charged surface, and then, UV light exposure was carried out for 20 seconds by using a high pressure mercury light source apparatus for printing use with a means for suction attaching used in Example 1.). Surface potentials were measured at both exposed and unexposed portion after 1 minute from completion of exposure, and it was shown that potential at exposed portion was +50 V and at unexposed, +250 V, thereby forming a static latent image.

Further, the wiring board was reversed and in the same manner, after unexposed surface was statically charged by a corona charging device (charging voltage: +5.0 kV), a film mask on which an image pattern had been drawn was placed on this charged surface, and then, UV light exposure was carried out for 20 seconds by using a high pressure mercury light source apparatus for printing use with a means for suction attaching used in Example 1. Surface potentials were measured at both exposed and unexposed portion after 1 minute from completion of exposure, and it was shown similarly that potential at exposed portion was +50 V and at unexposed, +250 V, thereby forming a static latent image.

Then, by using a positively charged toner used in Example 1, a reverse development was carried out by applying a bias voltage of +200V to obtain toner images on both surfaces. The obtained toner images were fixed by heating at 70° C. for 10 minutes to obtain fixed images.

Using an aqueous solution of 1% sodium carbonate, a portion of the photoconductive layer other than the toner image was removed by dissolution to obtain resists for wiring portions on the both surfaces which were colored blue and comprised the toner image and the photoconductive layer. When these resist patterns were evaluated, on the surface on which charging, exposure and toner development were carried out after reversing the wiring board, there were left numbers of resists in a non-wiring portion as a noise, since a static latent image was disturbed by a contact with an exposing device.

Further, using the residual toner image and the photoconductive layer as an etching resist, a copper layer was removed by etching by spraying a ferric chloride solution used in Example 1, heated at 45° C. and under spraying pressure of 2.5 kg/cm$^2$ for 2 minutes. Subsequently, the etching resist was removed by an aqueous solution of 3% sodium hydroxide. As a result, on a surface where a good resist pattern for circuit was formed, a copper circuit pattern was formed. However, on the surfaces where resists were left as a noise in non-wiring portion, copper is left behind in a non-wiring portion corresponding to a resist noise, thereby failing to form a good circuit pattern.

According to the process of the present invention, it is possible to exclude a mechanical contact from the processes after formation of the electrostatic latent image until prior to the toner developing, and exclude sensor disturbance totally by providing a photoconductive layer, in which its chargeability is changed by light exposure on a conductive support which comprises an insulating substrate and metal conductive layer; initially exposing it with a practical light with a wavelength of 500 nm or less through a resist pattern to generate a difference in statically charging property corresponding to the resist pattern; followed by statically charging the photoconductive layer to form an electrostatic latent image; forming a toner image on the photoconductive layer with an electrophotographic method; removing a portion of the photoconductive layer to which no toner is attached by dissolution to form a resist image; and removing a portion of the metal conductive layer other than a portion where the resist image is formed by etching.

As a result, this process enables to prepare a printed wiring board with fewer defects such as residual copper, wire shortening, wire cutting, etc. without a trace of contact made with devices during process. Further, by providing a photoconductive layer containing a charge transfer material on the metal conductive layer of the insulating substrate, there can be provided a electrophotographic printed wiring board that has a sensitivity for a practical UV light and is excellent in reproducing fine lines.

What is claimed is:

1. A process for producing a printed wiring board which comprises the steps of:

a) exposing a wiring board having at least one photoconductive layer in which its chargeability is changed by light exposure on at least one surface of a conductive support which comprises an insulating substrate and at least one metal conductive layer provided on at least one surface thereof through a resist pattern;

b) charging the photoconductive layer to form an electrostatic latent image;

c) forming a toner image on the photoconductive layer by toner developing treatment;

d) removing a portion of the photoconductive layer to which no toner is attached by dissolution to form a resist image; and e) removing a portion of the metal conductive layer other than a portion where the resist image is formed by etching.

2. The process for producing a printed wiring board according to claim 1, wherein the photoconductive layer in which its chargeability is changed by light exposure contains a photoconductive material which changes its chargeability by light exposure with a wavelength shorter than 500 nm.

3. The process for producing a printed wiring board according to claim 2, wherein the photoconductive layer in which its chargeability is changed by light exposure contains photoconductive material in which its chargeability is not changed by light exposure with a wavelength of 500 nm or longer.

4. The process for producing a printed wiring board according to claim 1, wherein the photoconductive layer contains a charge transfer material which absorbs light with wavelength shorter than 500 nm, a resin soluble for an alkali solution and an anthraquinone type dye represented by the formula (I):

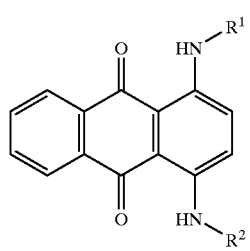

(I)

wherein $R^1$ and $R^2$ each independently represent an alkyl group, an aryl group, or an aralkyl group, and $R^1$ and $R^2$ may be the same or different from each other.

5. The process for producing a printed wiring board according to claim 1, wherein, in a wiring board comprising a metal conductive layer provided on an insulating substrate, and a photoconductive layer provided thereon, the photoconductive layer contains at least one charge transfer material selected from those represented by the formulae (II), (III), (IV), (V) and (VI) and a polymer soluble for an alkali treating solution, and chargeability of which is changed by UV light exposure:

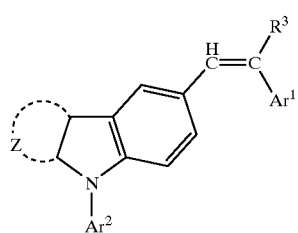

(II)

wherein $R^3$ represents a hydrogen atom, an alkyl group, or an aryl group, and $Ar^1$ and $Ar^2$ each independently represent an aryl group which may be the same or different from each other, and Z represents an alkylene group with a carbon number of 3 or 4, that forms a 5-membered ring or 6-membered ring bonded to a pyrrolidine ring,

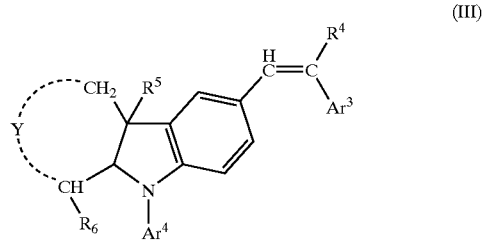

(III)

wherein $R^4$ represents a hydrogen atom, an alkyl group, or an aryl group, and $Ar^3$ and $Ar^4$ each independently represent an aryl group; $R^5$ and $R^6$ each independently represent a hydrogen atom or an alkyl group provided that at least one of $R^5$ and $R^6$ is an alkyl group; and Y is an alkylene group with a carbon number of 1 or 2 that forms a 5-membered ring or 6-membered ring with two carbon atoms bonded to a pyrrolidine ring,

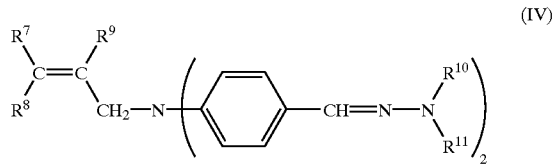

(IV)

wherein $R^7$, $R^8$ and $R^9$ each independently represent a hydrogen atom or an alkyl group, and $R^{10}$ and $R^{11}$ each independently represent an alkyl group or an aryl group,

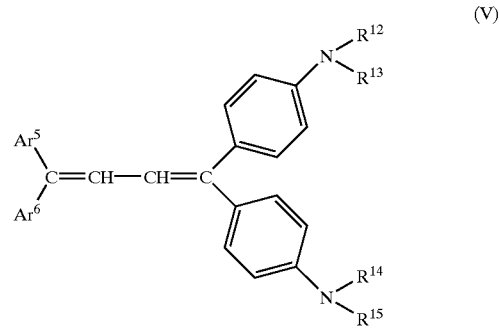

(V)

wherein $Ar^5$ and $Ar^6$ each independently represent an aryl group, and $R^{12}$, $R^{13}$, $R^{14}$ and $R^{15}$ each independently represent an alkyl group or an aralkyl group, and

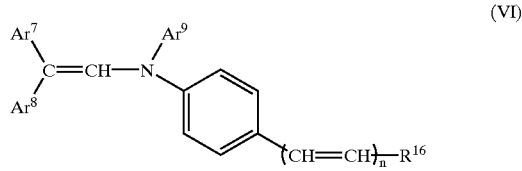

(VI)

wherein $Ar^7$, $Ar^8$, $Ar^9$ and $R^{16}$ each independently represent an aryl group, and they may be the same or different from each other, and n represents an integer of 1 or 2.

6. The process for producing a printed wiring board according to claim 5, wherein the photoconductive layer contains at least one of the compounds represented by the formulae (VII), (VIII), (IX), (X), (XI), (XII) and (XIII) in an amount of 0.1 to 30% by mass based on the total amount of the charge transfer materials represented by the formulae (II), (III), (IV), (V) and (VI):

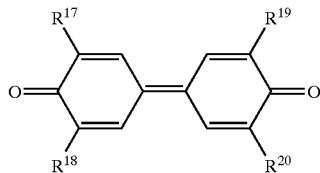

(VII)

wherein $R^{17}$, $R^{18}$, $R^{19}$ and $R^{20}$ each independently represent an alkyl group or an alkoxy group, which may be the same or different from each other,

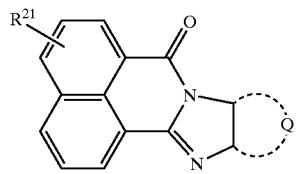

(VIII)

wherein $R^{21}$ is a substituent on a naphthalene ring and represents a hydrogen atom, a halogen atom, a hydroxyl group, a nitro group, an alkylamino group, an alkoxy group, an alkenyloxy group, an aralkyloxy group or an alkenyl group, Q represents an aromatic hydrocarbon residue that is condensed to form a bond with an imidazoline ring,

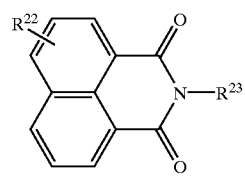

(IX)

wherein $R^{22}$ is a substituent on a naphthalene ring and represents a hydrogen atom, a halogen atom, a hydroxyl group, a nitro group, an alkylamino group, an alkoxy group, an alkenyloxy group, an aralkyloxy group or an alkenyl group, and $R^{23}$ represents an alkyl group or an aryl group which may be further substituted,

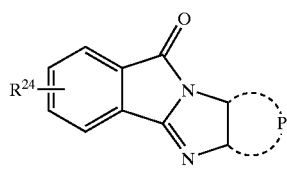

(X)

wherein $R^{24}$ is a substituent on a benzene ring and represents a hydrogen atom, a halogen atom, or a nitro group, and P represents an aromatic hydrocarbon residue that is condensed to form a bond with an imidazoline ring,

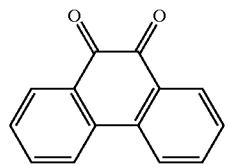

(XI)

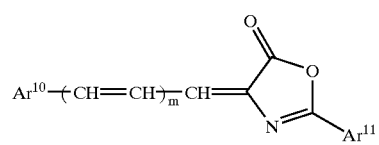

(XII)

wherein $Ar^{10}$ and $Ar^{11}$ each independently represent an aryl group and may be further substituted; and m represents an integer of 0 or 1,

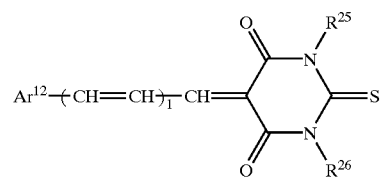

(XIII)

wherein $Ar^{12}$ represents an aryl group and each of $R^{25}$ and $R^{26}$ represents an alkyl group which may be further substituted and l represents an integer of 0 or 1.

7. The process for producing a printed wiring board according to claim 5, wherein the photoconductive layer contains the anthraquinone type dye represented by the formula (I) in an amount of 0.1 to 10% by mass based on the total solid amount of the photoconductive layer.

8. The process for producing a printed wiring board according to claim 6, wherein the photoconductive layer contains the anthraquinone type dye represented by the formula (I) in an amount of 0.1 to 10% by mass based on the total solid amount of the photoconductive layer.

9. The process for producing a printed wiring board according to claim 5, wherein the photoconductive layer does not change its chargeability by light exposure with a wavelength of 500 nm or longer.

10. The process for producing a printed wiring board according to claim 6, wherein the photoconductive layer does not change its chargeability by light exposure with a wavelength of 500 nm or longer.

11. The process for producing a printed wiring board according to claim 7, wherein the photoconductive layer does not change its chargeability by light exposure with a wavelength of 500 nm or longer.

12. The process for producing a printed wiring board according to claim 8, wherein the photoconductive layer does not change its chargeability by light exposure with a wavelength of 500 nm or longer.

13. The process for producing a printed wiring board according to claim 1, wherein the wiring board having photoconductive layers in which their chargeabilities are changed by light exposure are provided on both surface of a conductive support which comprises an insulating substrate and metal conductive layers provided on both surface thereof is exposed through a resist pattern on one surface followed by the other, then, the both surfaces of the photoconductive layers are charged to form electrostatic latent images on both surfaces, followed by carrying out toner image formation, resist image formation, and etching of the metal conductive layers for both surfaces simultaneously.

14. The process for producing a printed wiring board according to claim 13, wherein the photoconductive layer in which its chargeability is changed by light exposure contains a photoconductive material which changes its chargeability by light exposure with a wavelength shorter than 500 nm.

15. The process for producing a printed wiring board according to claim 14, wherein the photoconductive layer in which its chargeability is changed by light exposure contains photoconductive material which does not change its chargeability by light exposure with a wavelength of 500 nm or longer.

16. The process for producing a printed wiring board according to claim 13, wherein the photoconductive layer contains charge transfer material which absorb light with wavelength shorter than 500 nm, a resin soluble for an alkali solution and an anthraquinone type dye represented by the formula (I):

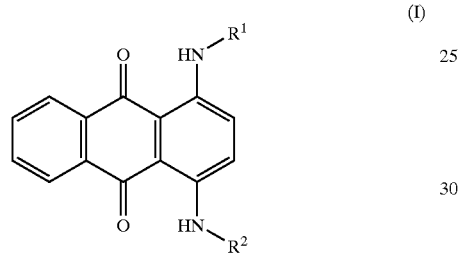

(I)

wherein $R^1$ and $R^2$ each independently represent an alkyl group, an aryl group, or an aralkyl group, and $R^1$ and $R^2$ may be the same or different from each other.

17. The process for producing a printed wiring board according to claim 13, wherein, in a wiring board comprising a metal conductive layer provided on an insulating substrate, and a photoconductive layer provided thereon, the photoconductive layer contains at least one charge transfer material selected from those represented by the formulae (II), (III), (IV), (V) and (VI) and a polymer soluble for an alkali treating solution, and chargeability of which is changed by UV light exposure:

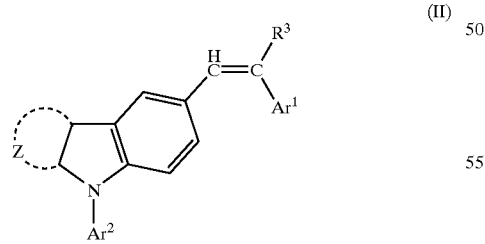

(II)

wherein $R^3$ represents a hydrogen atom, an alkyl group, or an aryl group, and $Ar^1$ and $Ar^2$ each independently represent an aryl group which may be the same or different from each other, and Z represents an alkylene group with a carbon number of 3 or 4, that forms a 5-membered ring or 6-membered ring bonded to a pyrrolidine ring,

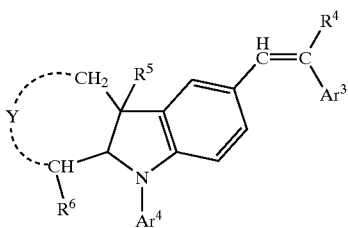

(III)

wherein $R^4$ represents a hydrogen atom, an alkyl group, or an aryl group, and $Ar^3$ and $Ar^4$ each independently represent an aryl group; $R^5$ and $R^6$ each independently represent a hydrogen atom or an alkyl group provided that at least one of $R^5$ and $R^6$ is an alkyl group; and Y is an alkylene group with a carbon number of 1 or 2 that forms a 5-membered ring or 6-membered ring with two carbon atoms bonded to a pyrrolidine ring,

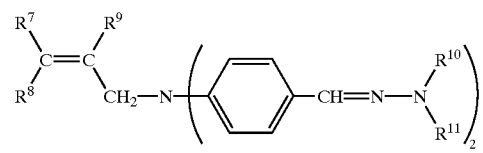

(IV)

wherein $R^7$, $R^8$ and $R^9$ each independently represent a hydrogen atom or an alkyl group, and $R^{10}$ and $R^{11}$ each independently represent an alkyl group or an aryl group,

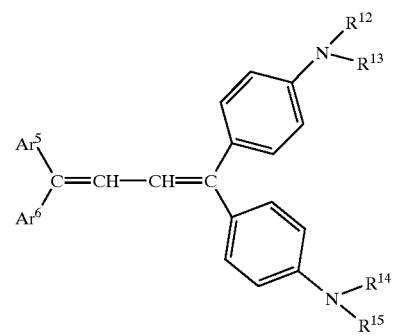

(V)

wherein $Ar^5$ and $Ar^6$ each independently represent an aryl group, and $R^{12}$, $R^{13}$, $R^{14}$ and $R^{15}$ each independently represent an alkyl group or an aralkyl group, and

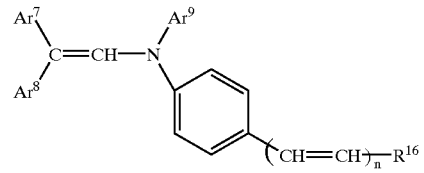

(VI)

wherein $Ar^7$, $Ar^8$, $Ar^9$ and $R^{16}$ each independently represent an aryl group, and they may be the same or different from each other, and n represents an integer of 1 or 2.

18. The process for producing a printed wiring board according to claim 17, wherein the photoconductive layer contains at least one of the compounds represented by the formulae (VII), (VIII), (IX), (X), (XI), (XII) and (XIII) in an amount of 0.1 to 30% by mass based on the total amount of the charge transfer materials represented by the formulae (II), (III), (IV), (V) and (VI):

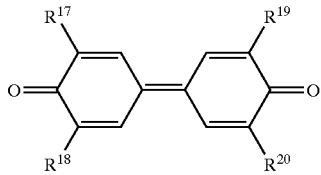

(VII)

wherein $R^{17}$, $R^{18}$, $R^{19}$ and $R^{20}$ each independently represent an alkyl group or an alkoxy group, which may be the same or different from each other,

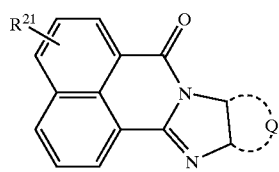

(VIII)

wherein $R^{21}$ is a substituent on a naphthalene ring and represents a hydrogen atom, a halogen atom, a hydroxyl group, a nitro group, an alkylamino group, an alkoxy group, an alkenyloxy group, an aralkyloxy group or an alkenyl group, and Q represents an aromatic hydrocarbon residue that is condensed to form a bond with an imidazoline ring,

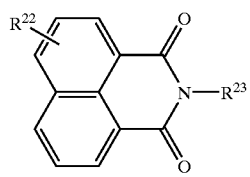

(IX)

wherein $R^{22}$ is a substituent on a naphthalene ring and represents a hydrogen atom, a halogen atom, a hydroxyl group, a nitro group, an alkylamino group, an alkoxy group, an alkenyloxy group, an aralkyloxy group or an alkenyl group, and $R^{23}$ represents an alkyl group or an aryl group which may be further substituted,

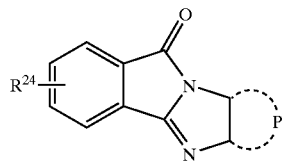

(X)

wherein $R^{24}$ is a substituent on a benzene ring and represents a hydrogen atom, a halogen atom, or a nitro group, and P represents an aromatic hydrocarbon residue that is condensed to form a bond with an imidazoline ring,

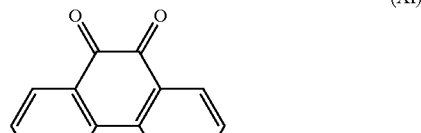

(XI)

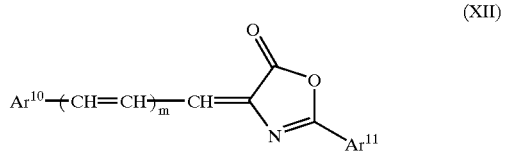

(XII)

wherein $Ar^{10}$ and $Ar^{11}$ each independently represent an aryl group and may be further substituted; and m represents an integer of 0 or 1,

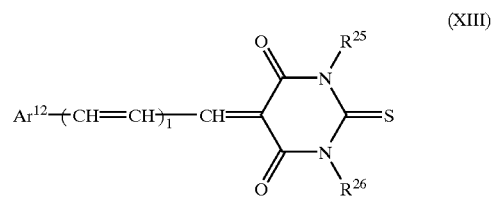

(XIII)

wherein $Ar^{12}$ represents an aryl group, and $R^{25}$ and $R^{26}$ each independently represents an alkyl group which may be further substituted and l represents an integer of 0 or 1.

19. The process for producing a printed wiring board according to claim 17, wherein the photoconductive layer contains the anthraquinone type dye represented by the formula (I) in an amount of 0.1 to 10% by mass based on the total solid amount of the photoconductive layer.

20. The process for producing a printed wiring board according to claim 18, wherein the photoconductive layer contains the anthraquinone type dye represented by the formula (I) in an amount of 0.1 to 10% by mass based on the total solid amount of the photoconductive layer.

21. The process for producing a printed wiring board according to claim 17, wherein the photoconductive layer does not change its chargeability by light exposure with a wavelength of 500 nm or longer.

22. The process for producing a printed wiring board according to claim 18, wherein the photoconductive layer does not change its chargeability by light exposure with a wavelength of 500 nm or longer.

23. The process for producing a printed wiring board according to claim 19, wherein the photoconductive layer does not change its chargeability by light exposure with a wavelength of 500 nm or longer.

24. The process for producing a printed wiring board according to claim 20, wherein the photoconductive layer does not change its chargeability by light exposure with a wavelength of 500 nm or longer.

* * * * *